US008072871B2

(12) United States Patent
Fujiie

(10) Patent No.: US 8,072,871 B2
(45) Date of Patent: Dec. 6, 2011

(54) SHORT-PULSE LIGHT-SOURCE DEVICE, LASER DRIVING METHOD, OPTICAL PICKUP, AND OPTICAL DISC APPARATUS

(75) Inventor: Kazuhiko Fujiie, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/734,654

(22) PCT Filed: Oct. 1, 2009

(86) PCT No.: PCT/JP2009/067524
§ 371 (c)(1),
(2), (4) Date: May 14, 2010

(87) PCT Pub. No.: WO2010/038908
PCT Pub. Date: Apr. 8, 2010

(65) Prior Publication Data
US 2010/0254249 A1      Oct. 7, 2010

(30) Foreign Application Priority Data
Oct. 3, 2008    (JP) ................................. 2008-259109

(51) Int. Cl.
*G11B 7/00* (2006.01)
(52) U.S. Cl. ......................... 369/121; 369/47.5; 369/116
(58) Field of Classification Search ........................ None
See application file for complete search history.

(56) References Cited

U.S. PATENT DOCUMENTS

| 5,107,483 | A  | * | 4/1992 | Nakajima et al. ............. 369/108 |
| 6,614,820 | B2 | * | 9/2003 | Hirata et al. ................ 372/38.02 |
| 7,835,409 | B2 | * | 11/2010 | Mizuuchi et al. ................ 372/25 |
| 2004/0257964 | A1 | * | 12/2004 | Watabe ........................... 369/116 |
| 2008/0144475 | A1 | * | 6/2008 | Hooft et al. .................... 369/121 |
| 2008/0205244 | A1 | * | 8/2008 | Kitabayashi ............. 369/112.04 |
| 2009/0109816 | A1 | * | 4/2009 | Usui et al. .................. 369/47.53 |
| 2010/0020375 | A1 | * | 1/2010 | Jeong et al. ..................... 359/22 |

FOREIGN PATENT DOCUMENTS

| JP | 63-121776 | 5/1988 |
| JP | 2005-37658 | 2/2005 |
| JP | 2006-278926 | 10/2006 |
| JP | 2007-096100 | 4/2007 |

* cited by examiner

*Primary Examiner* — Lixi C Simpson
(74) *Attorney, Agent, or Firm* — Wolf, Greenfield & Sacks, P.C.

(57) ABSTRACT

The present invention realizes the emission of a high-output short-pulse beam and a reduction in power consumption. A laser control unit (2) of a short-pulse light-source device (1) raises a gate pulse (PG) of a gate signal (SG) supplied to a power supply circuit (5) in such a manner that the gate pulse (PG) rises only for the duration of an extremely short pulse width (T) to include the rise time of a generated pulse (PL) of a pulse signal (SL) supplied to a driving circuit (6). In this way, necessary power can be supplied at the rise timing of the generated pulse (PL), and the power consumption (Pa) can be greatly reduced from the standard power consumption (Pb).

11 Claims, 24 Drawing Sheets

[FIG. 1]
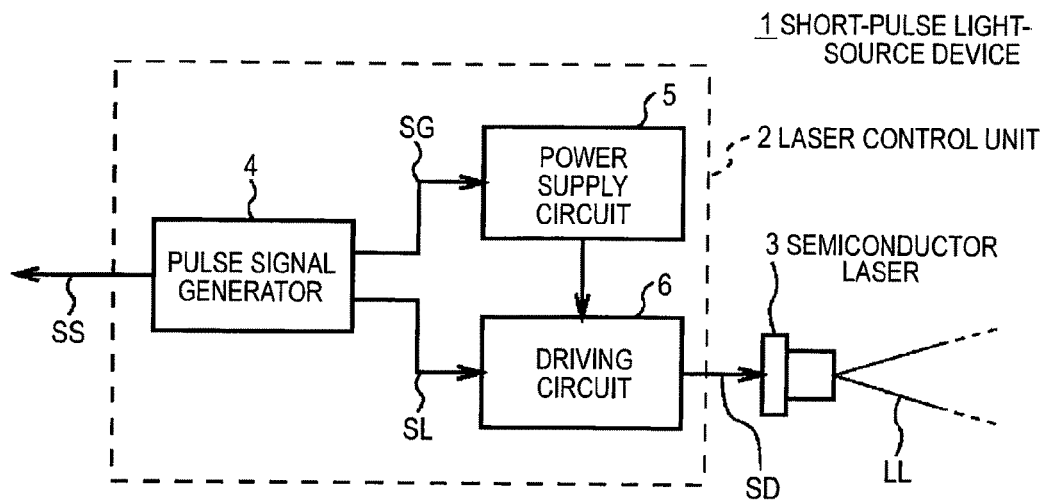
[FIG. 2]
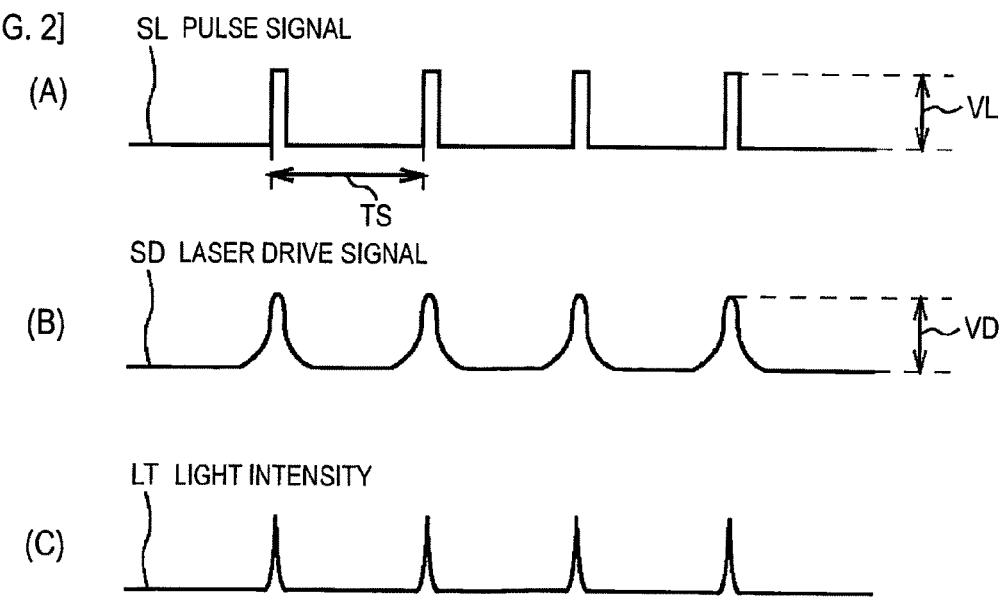

[FIG. 3]
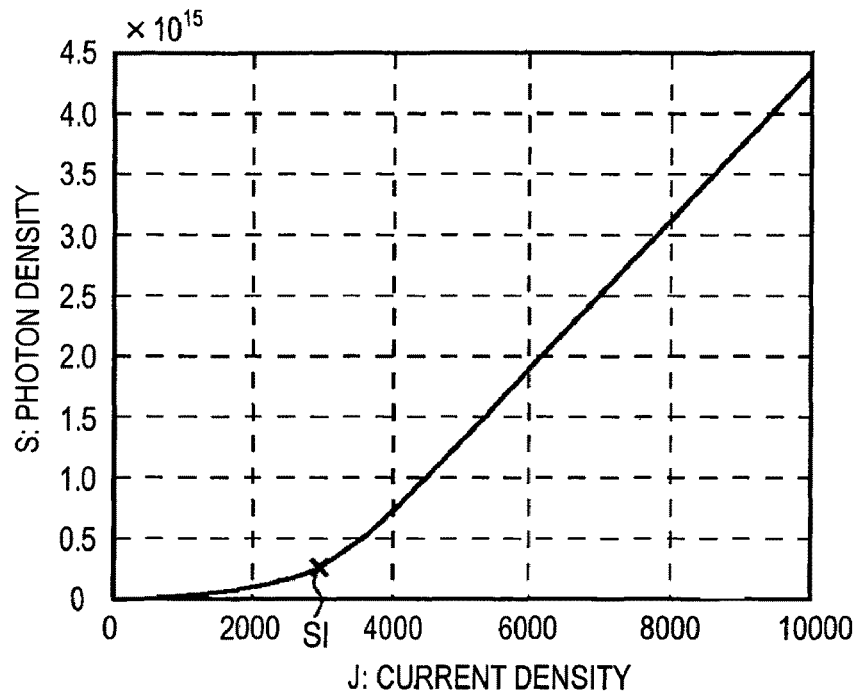
[FIG. 4]
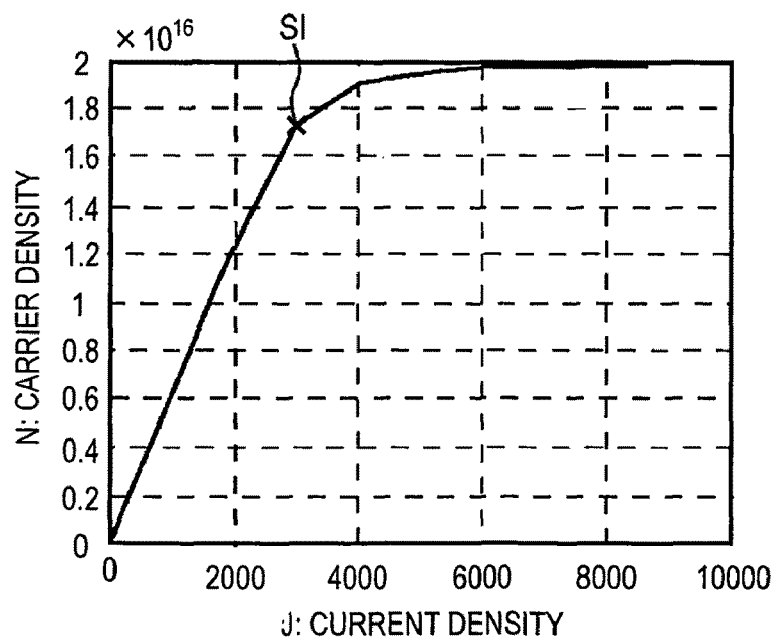

[FIG. 5]
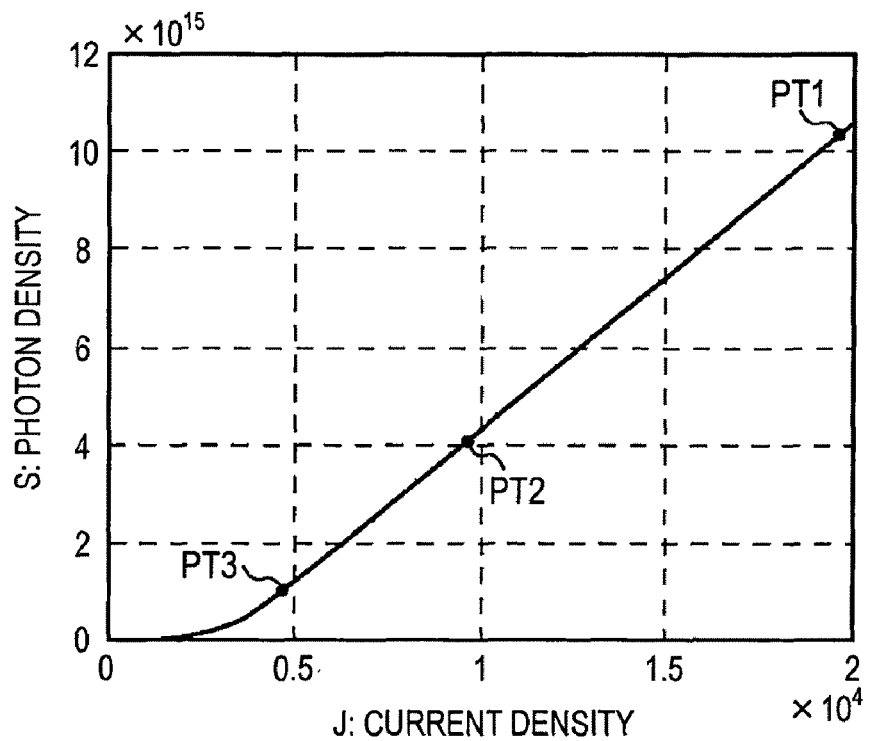
[FIG. 6]
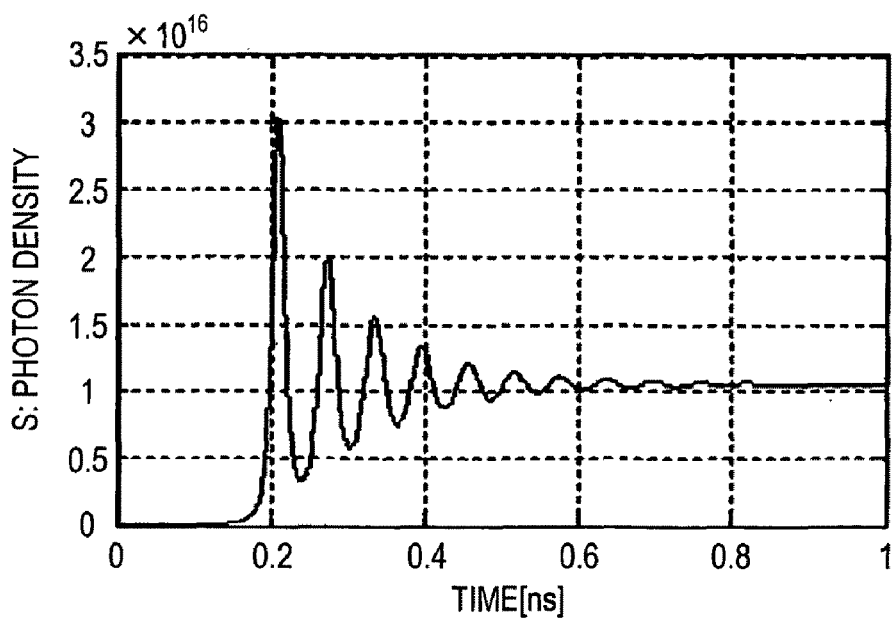

[FIG. 7]
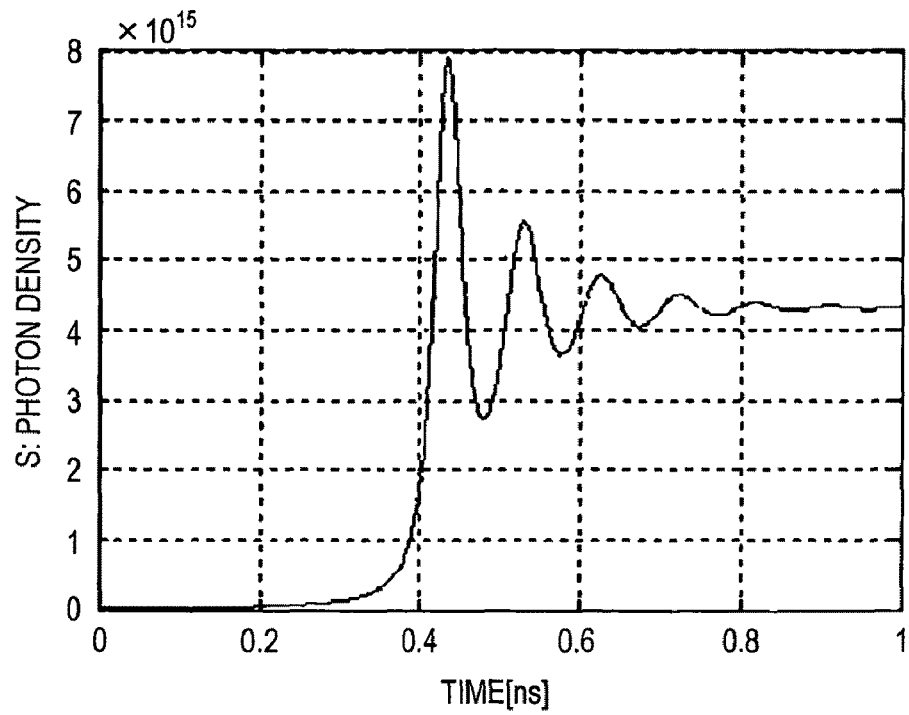
[FIG. 8]
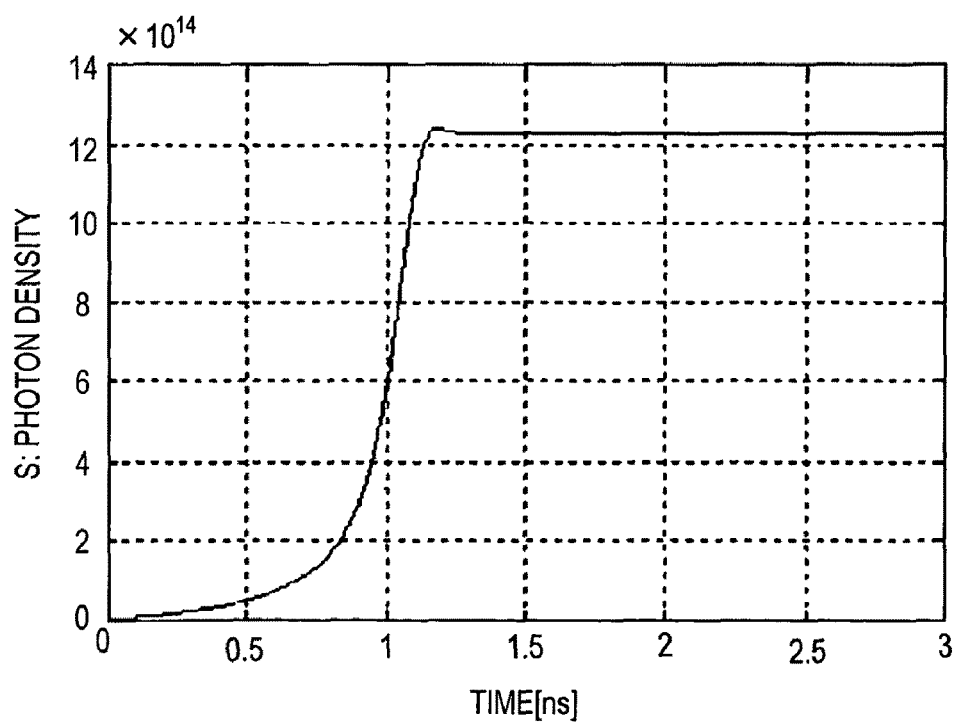

[FIG. 9]
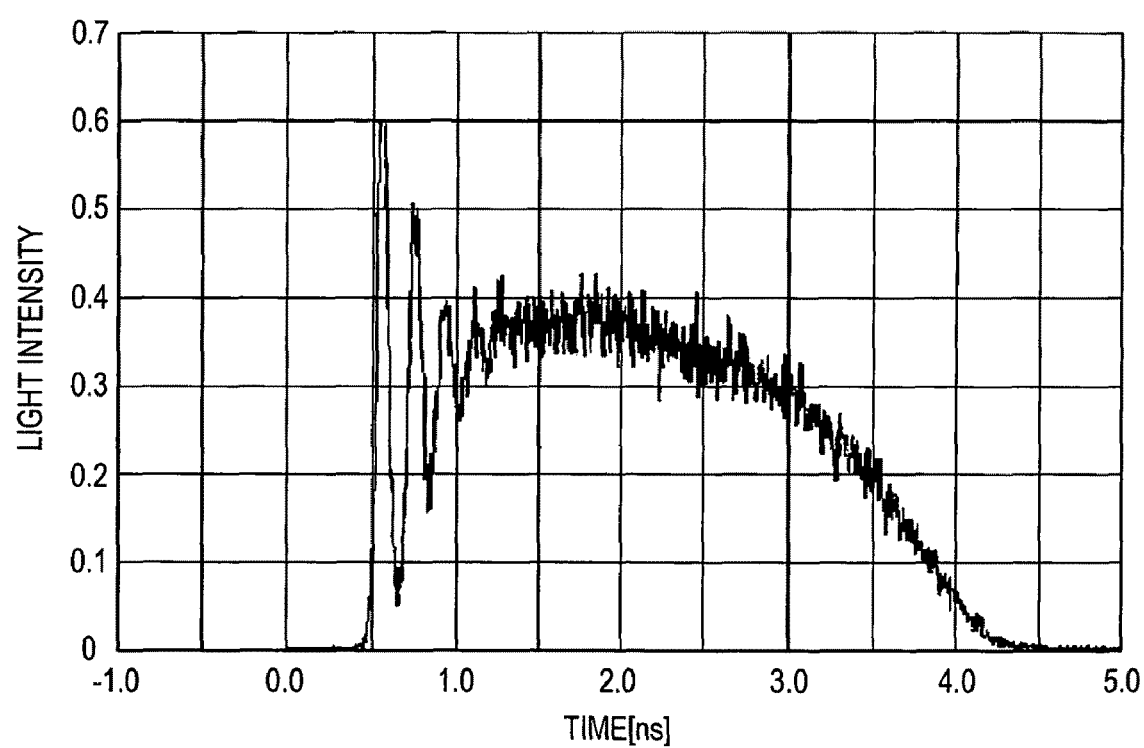

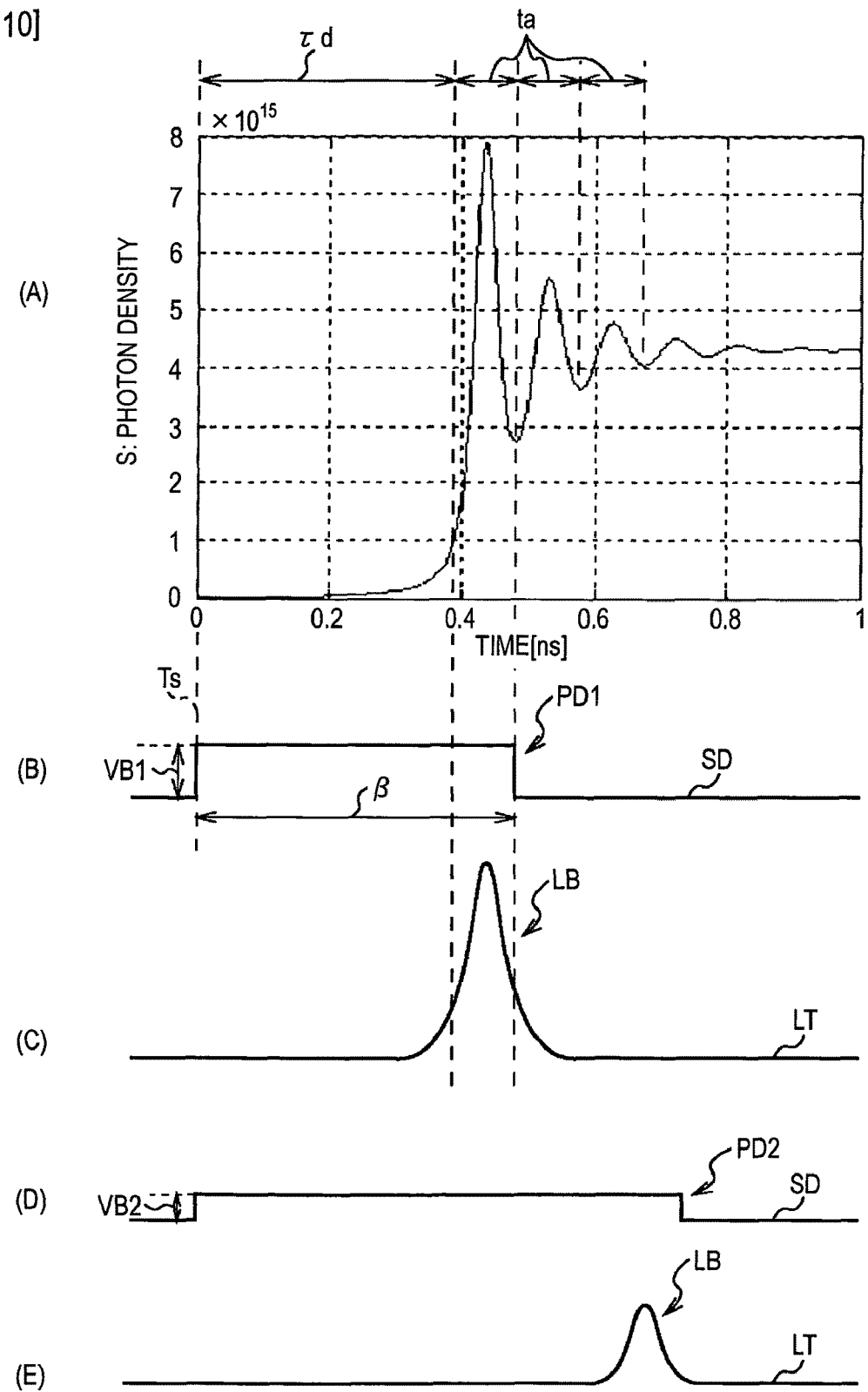

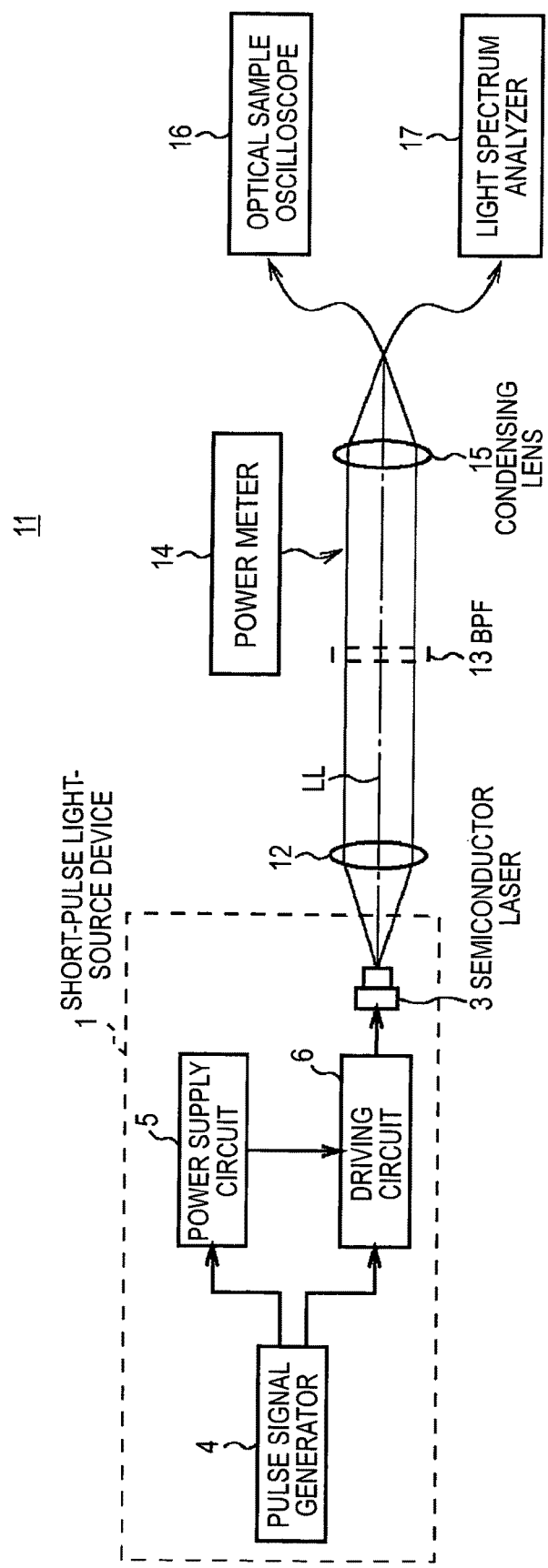
[FIG. 11]

[FIG. 12]
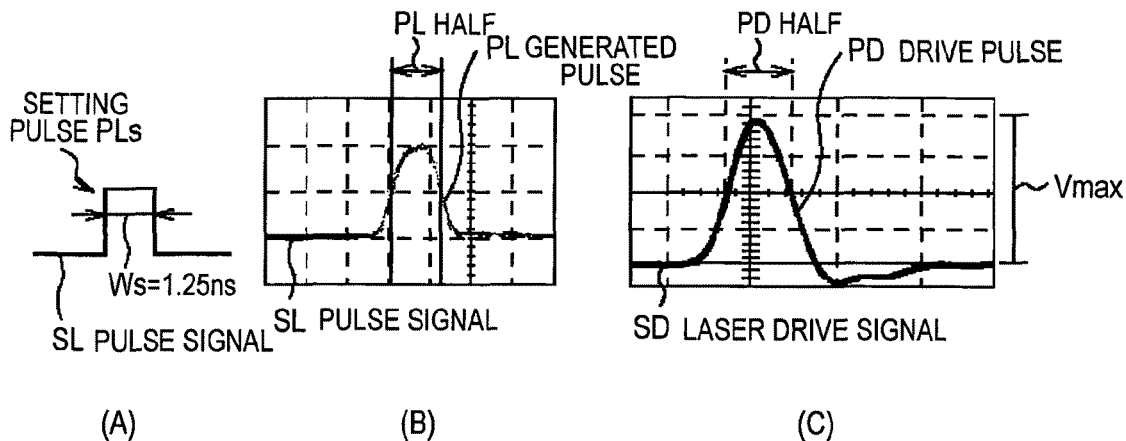
[FIG. 13]
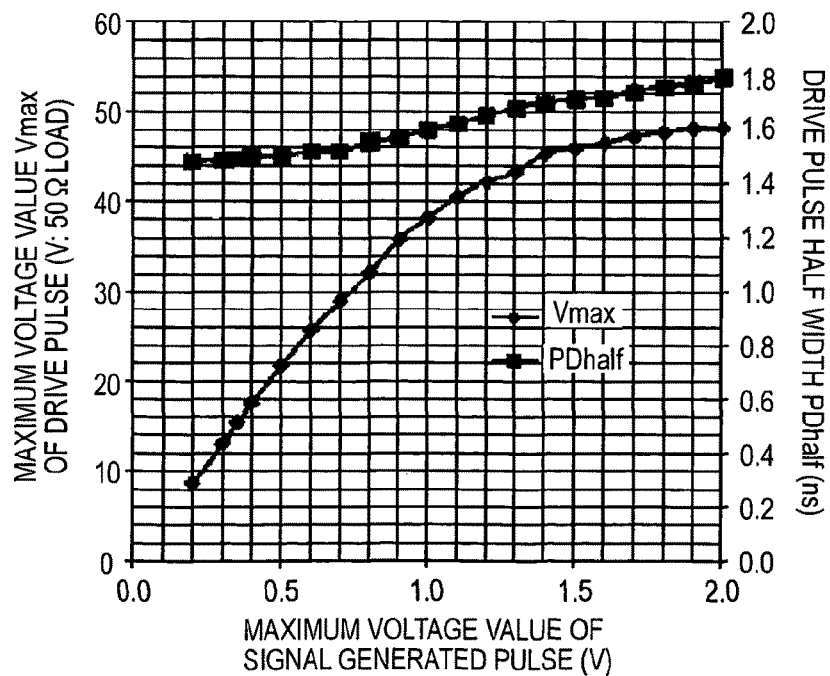

[FIG. 14]
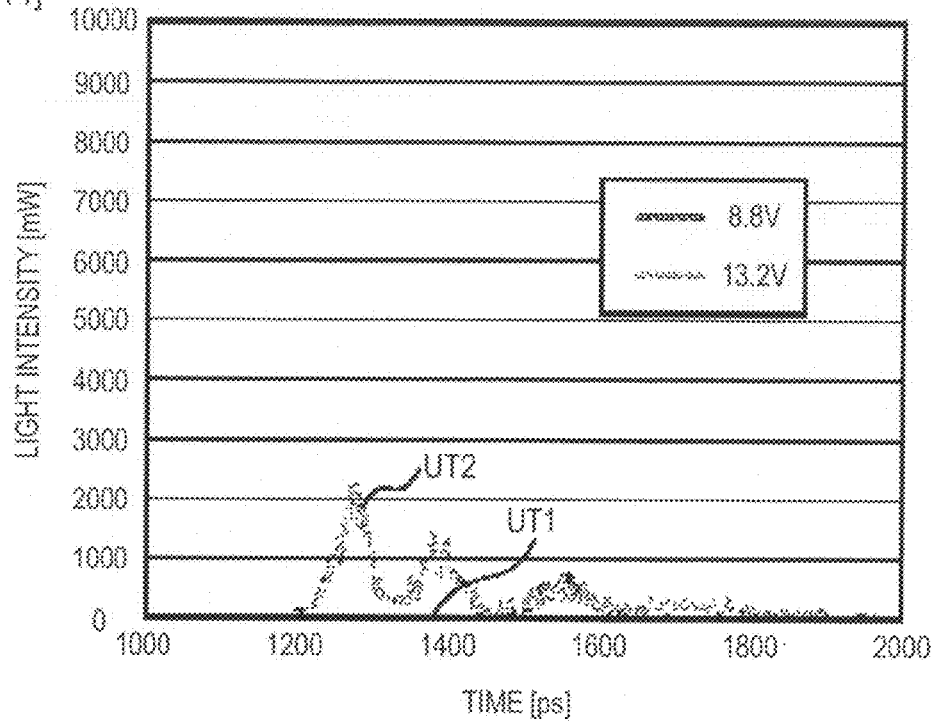
(A)
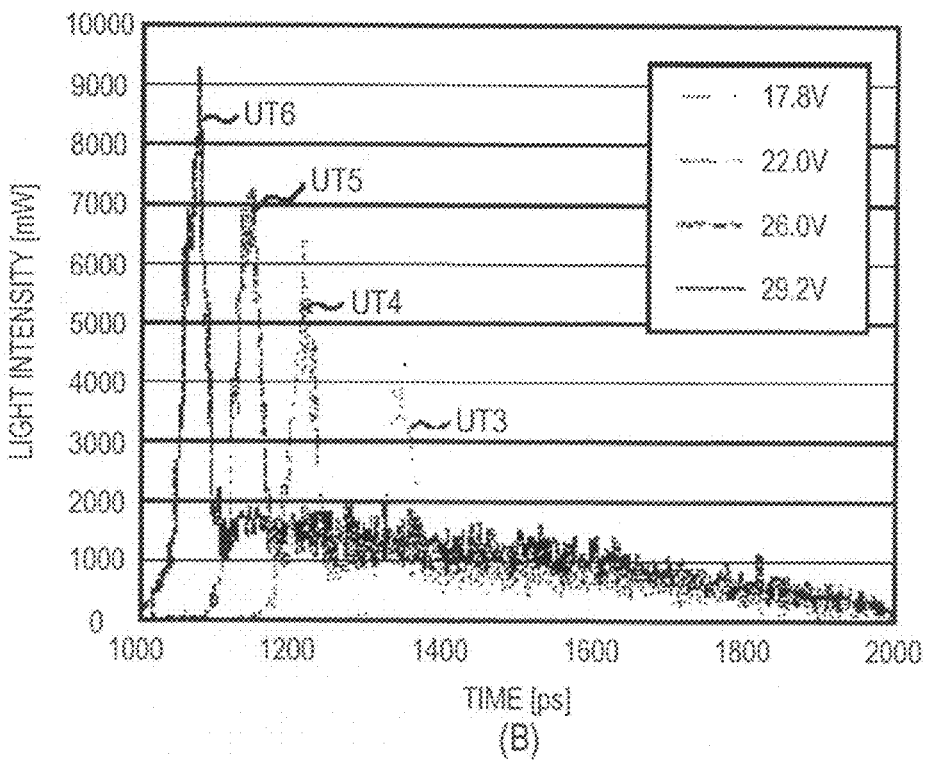
(B)

[FIG. 15]
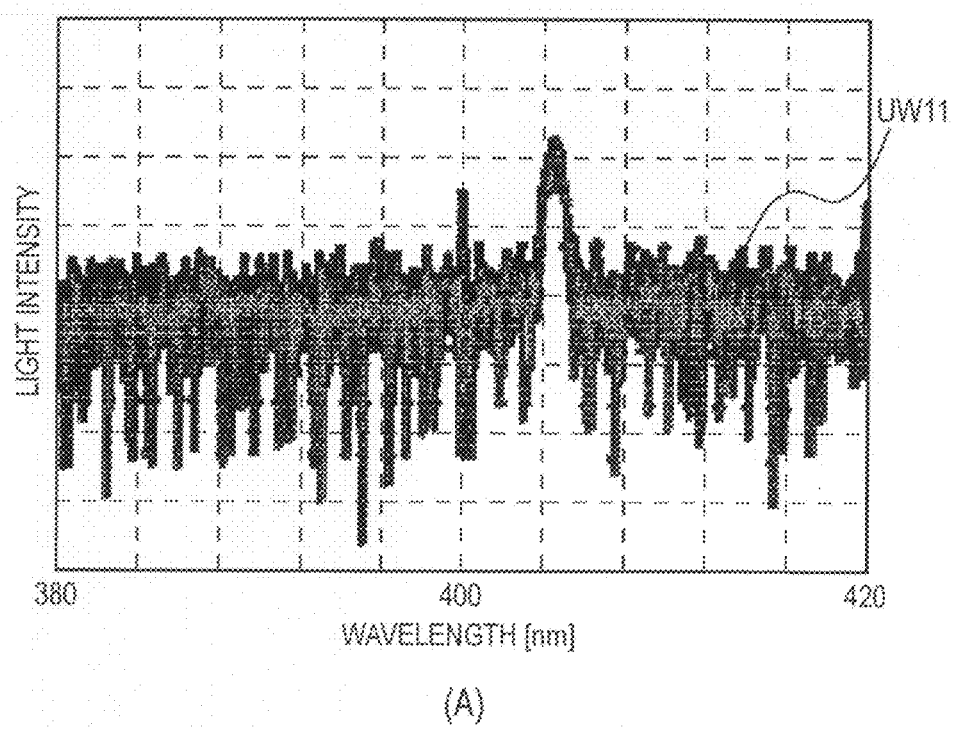
(A)
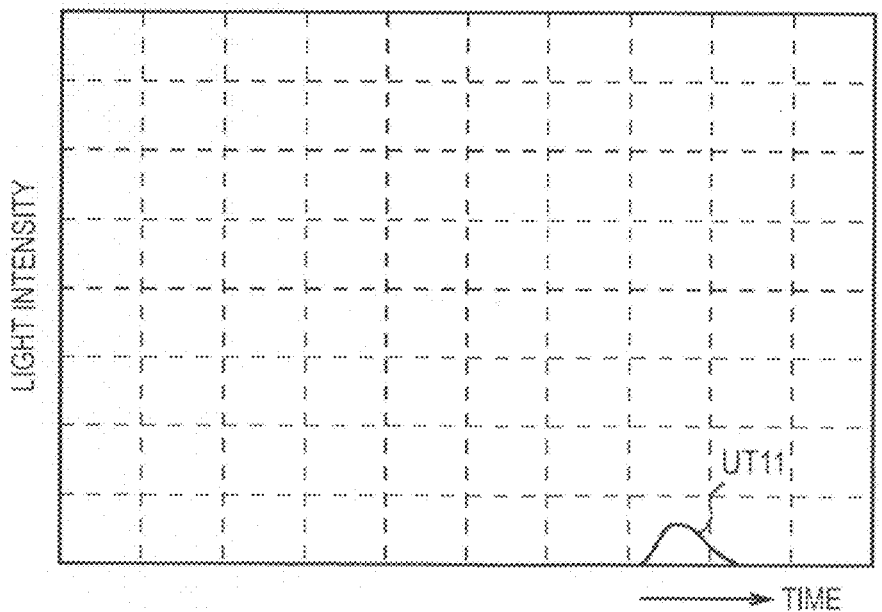
(B)

[FIG. 16]
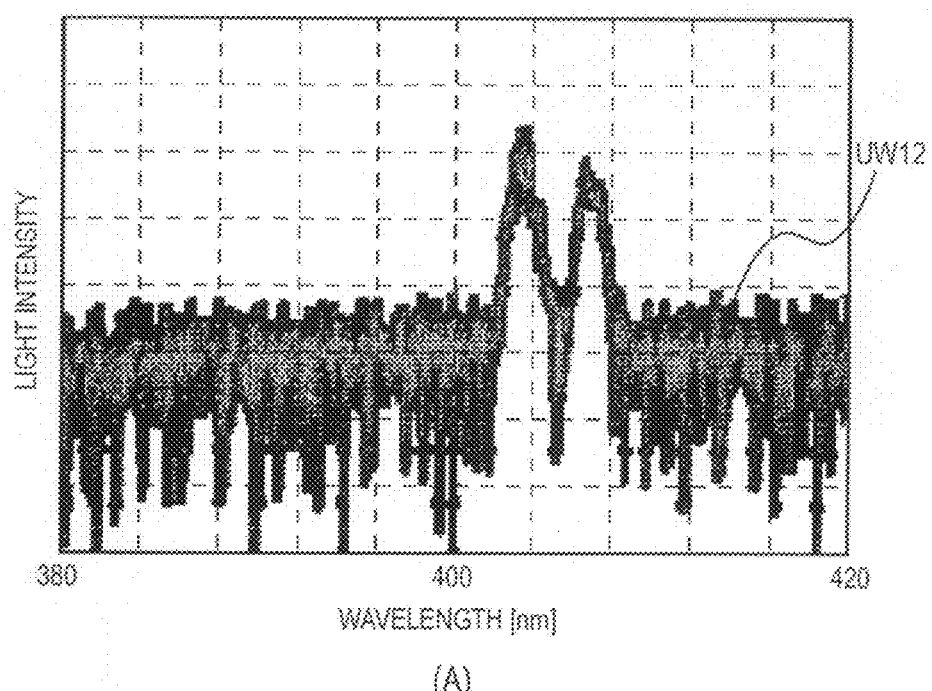
(A)
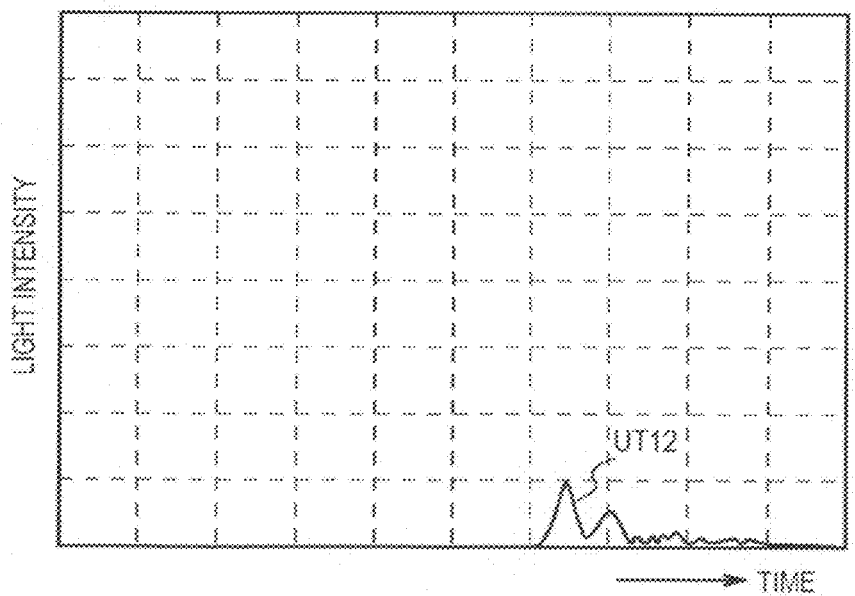
(B)

[FIG. 17]
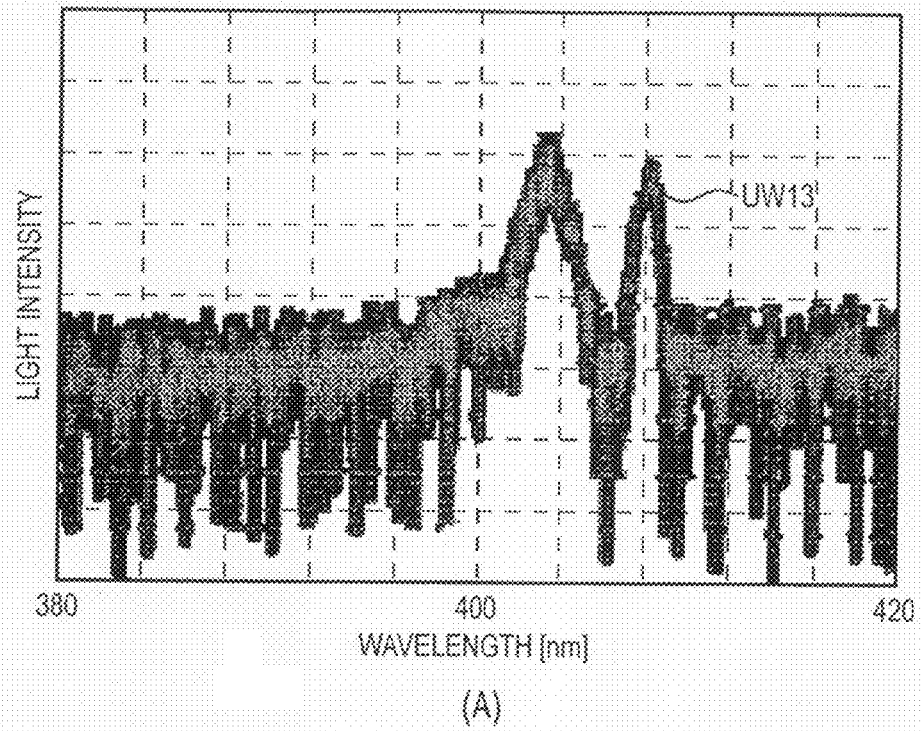
(A)
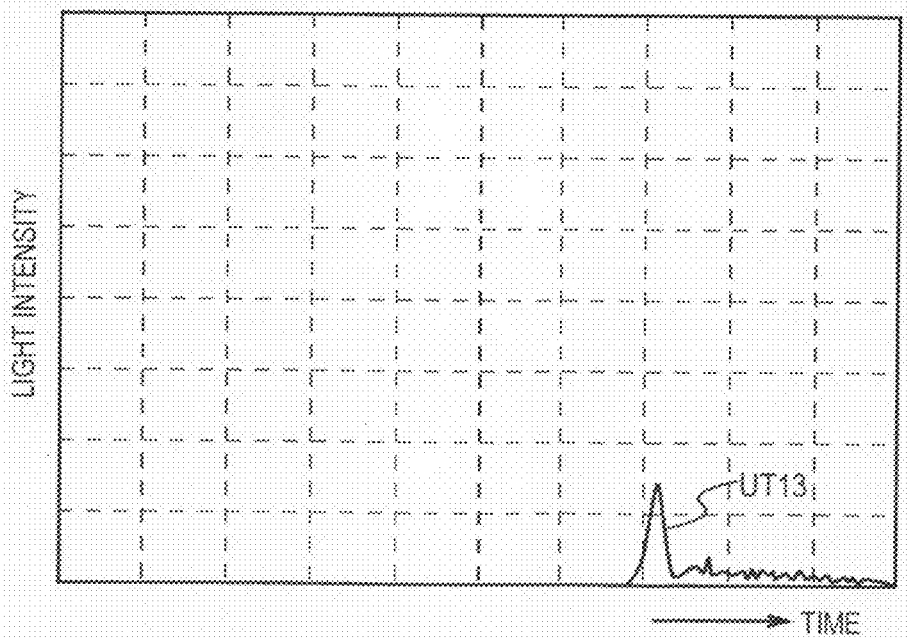
(B)

[FIG. 18]
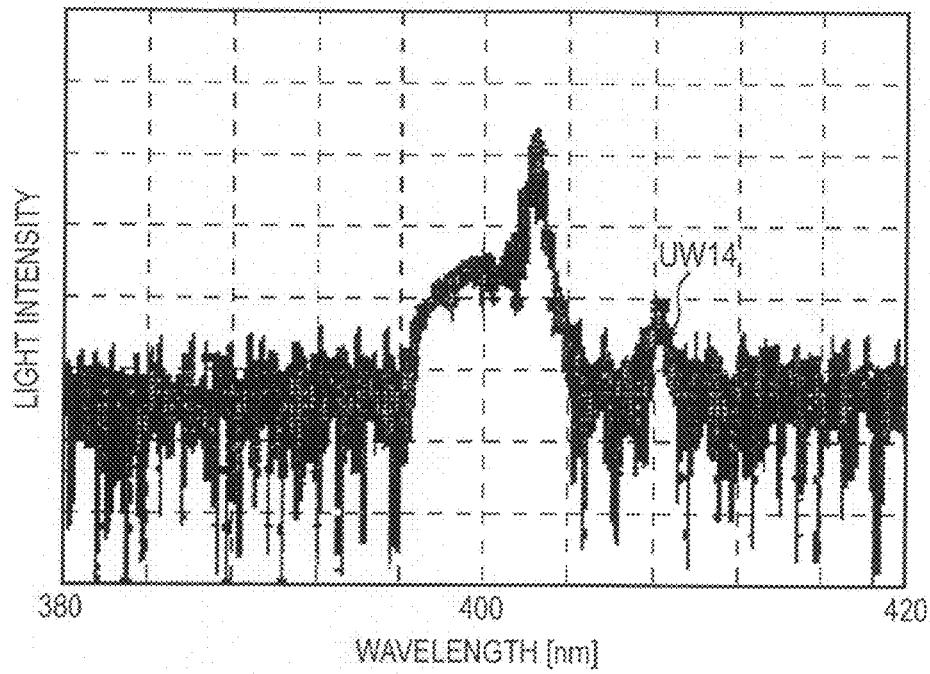
(A)
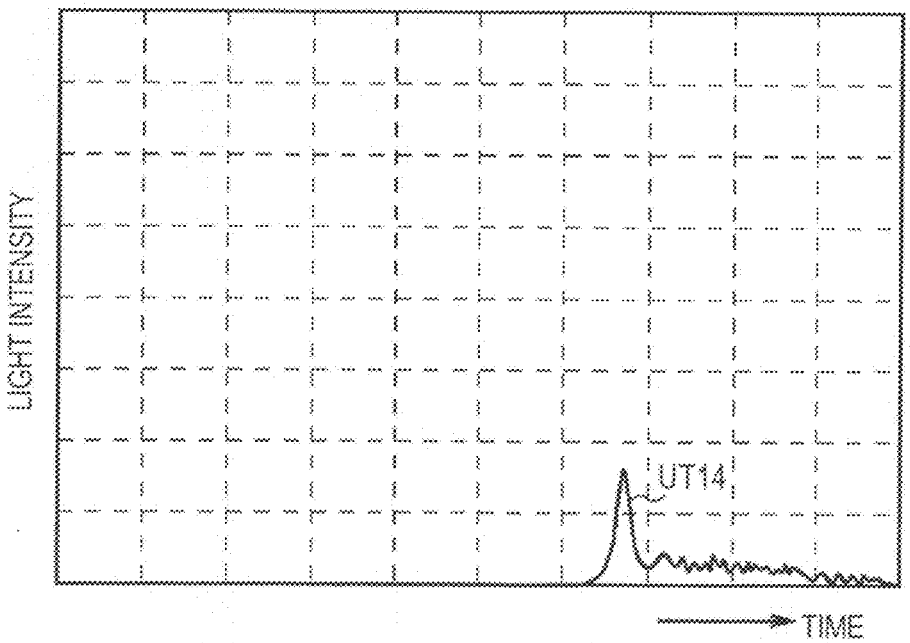
(B)

[FIG. 19]
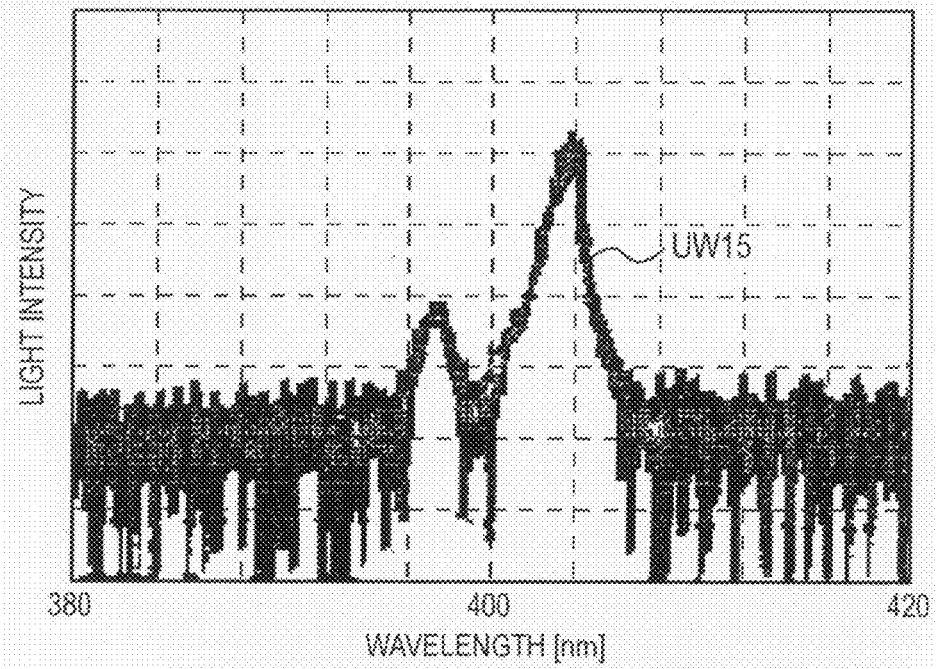
(A)
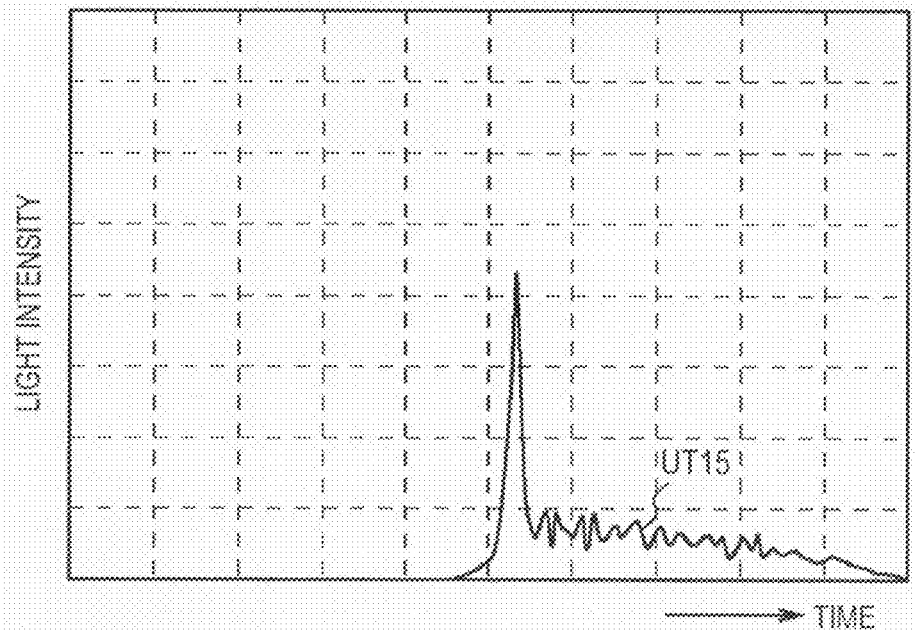
(B)

[FIG. 20]
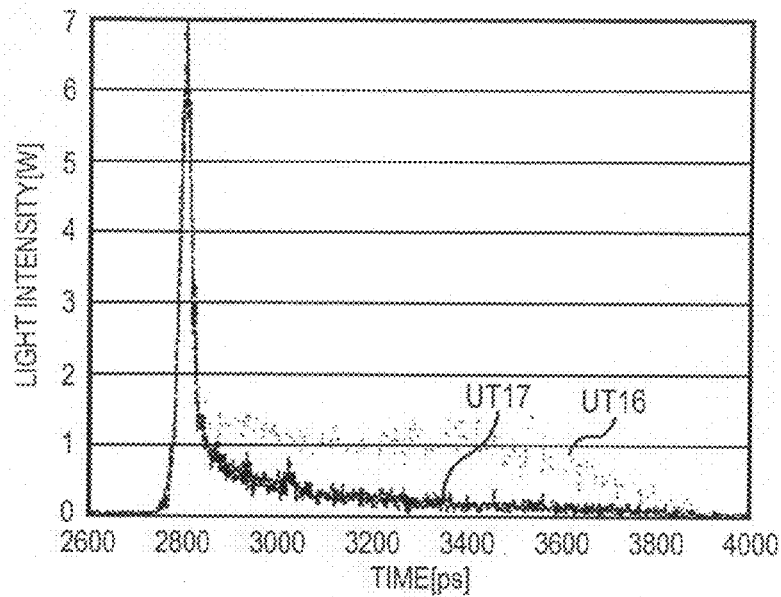
[FIG.21]
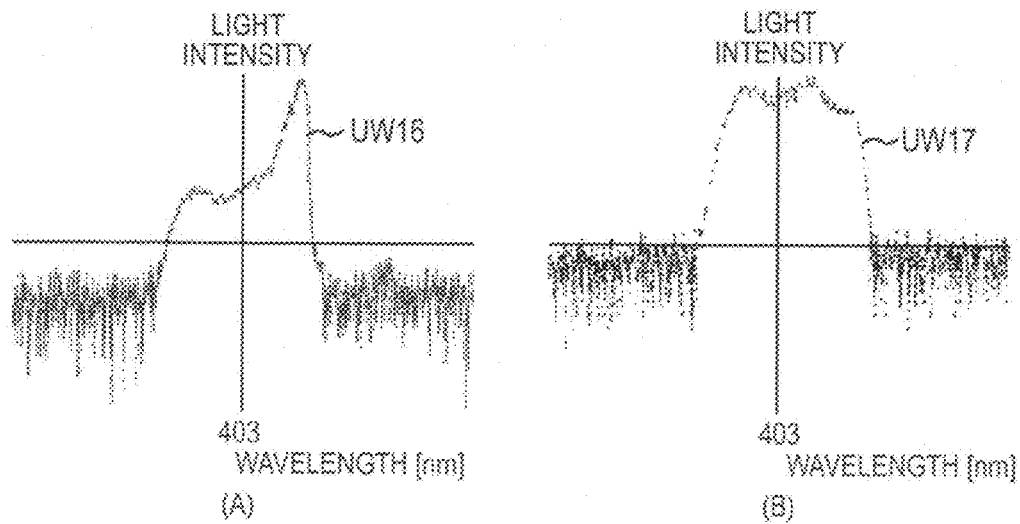
(A)        (B)

[FIG. 22]
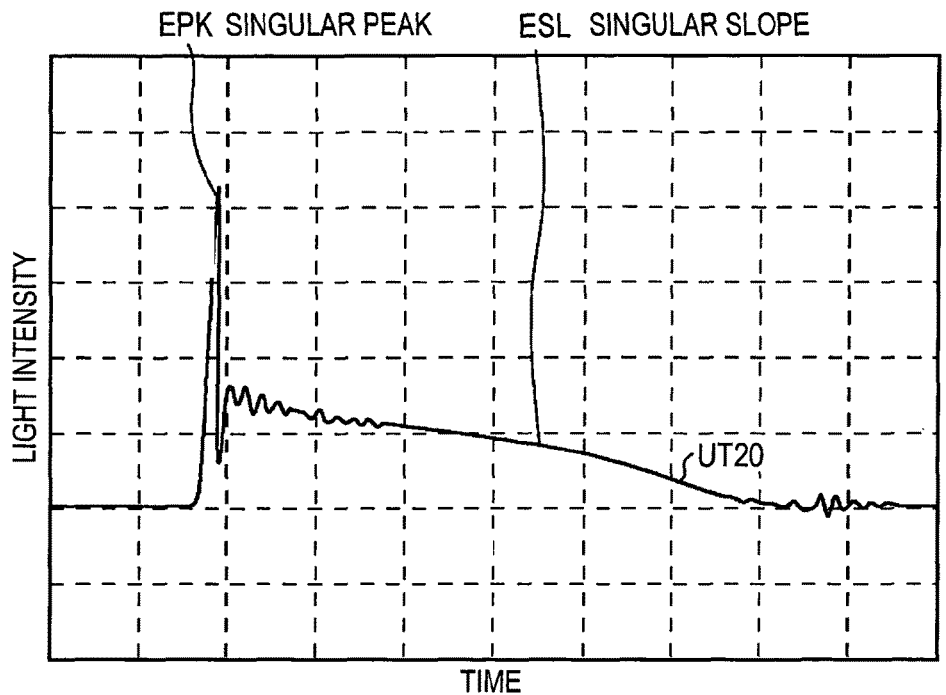
[FIG. 23]
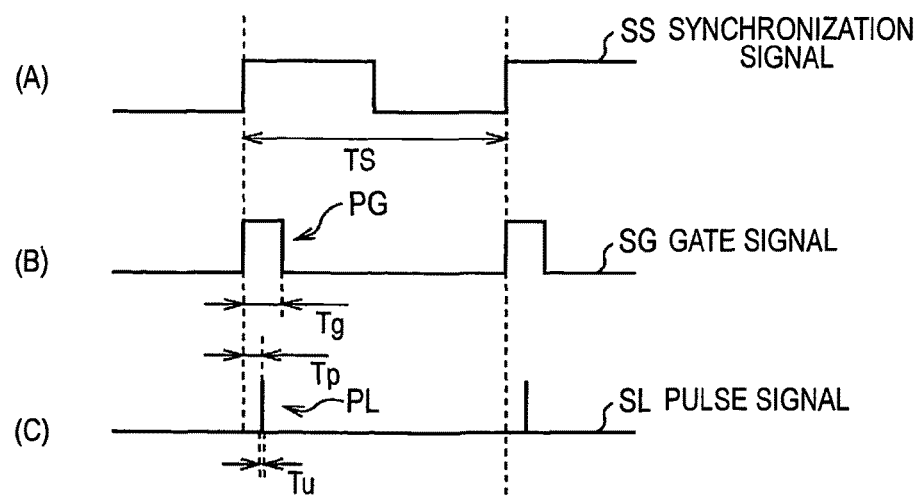

[FIG. 24]

| SET PATTERN | SEMICONDUCTOR LASER | | | | | | | DRIVING CIRCUIT | | | | |
|---|---|---|---|---|---|---|---|---|---|---|---|---|
| | LIGHT PULSE WIDTH t (s) | PEAK LIGHT OUTPUT Po (W) | PEAK VOLTAGE Vd (V) | PEAK CURRENT Id (A) | POWER CONSUMPTION Pd (W) | PULSE REPEATING FREQUENCY f (Hz) | STANDARD POWER CONSUMPTION Pb (W) | PULSE WIDTH Td (s) | PULSE WIDTH Tg (s) | CYCLE TS (s) | STANDARD POWER CONSUMPTION Pa (W) | POWER CONSUMPTION REDUCTION RATE (Pa/Pb) |
| PTN1 | 1.0E-13 | 1.0E+00 | 1.0E+01 | 1.0E+00 | 1.0E-04 | 1.0E+05 | 2.5E+00 | 1.0E-10 | 1.0E-07 | 1.0E-05 | 2.5E-02 | 1.0E-02 |
| PTN2 | 1.0E-13 | 1.0E+00 | 1.0E+01 | 1.0E+00 | 1.0E-03 | 1.0E+06 | 2.5E+00 | 1.0E-10 | 1.0E-08 | 1.0E-06 | 2.5E-02 | 1.0E-02 |
| PTN3 | 1.0E-13 | 1.0E+00 | 1.0E+01 | 1.0E+00 | 1.0E-02 | 1.0E+07 | 2.5E+00 | 1.0E-10 | 1.0E-08 | 1.0E-07 | 2.5E-01 | 1.0E-01 |
| PTN4 | 1.0E-13 | 1.0E+00 | 1.0E+01 | 1.0E+00 | 1.0E-01 | 1.0E+08 | 2.5E+00 | 1.0E-10 | 3.3E-09 | 1.0E-08 | 8.3E-01 | 3.3E-01 |
| PTN5 | 1.0E-13 | 1.0E+00 | 1.0E+01 | 1.0E+00 | 1.0E-01 | 3.0E+08 | 2.5E+00 | 1.0E-10 | 1.7E-09 | 3.3E-09 | 1.3E+00 | 5.0E-01 |
| PTN6 | 1.0E-12 | 3.3E+00 | 2.0E+01 | 2.0E+00 | 8.0E-04 | 1.0E+05 | 1.0E+01 | 2.0E-10 | 1.0E-07 | 1.0E-05 | 1.0E-01 | 1.0E-02 |
| PTN7 | 1.0E-12 | 3.3E+00 | 2.0E+01 | 2.0E+00 | 8.0E-03 | 1.0E+06 | 1.0E+01 | 2.0E-10 | 1.0E-08 | 1.0E-06 | 1.0E-01 | 1.0E-02 |
| PTN8 | 1.0E-12 | 3.3E+00 | 2.0E+01 | 2.0E+00 | 8.0E-02 | 1.0E+07 | 1.0E+01 | 2.0E-10 | 1.0E-08 | 1.0E-07 | 1.0E+00 | 1.0E-01 |
| PTN9 | 1.0E-12 | 3.3E+00 | 2.0E+01 | 2.0E+00 | 8.0E-01 | 1.0E+08 | 1.0E+01 | 2.0E-10 | 3.3E-09 | 1.0E-08 | 3.3E+00 | 3.3E-01 |
| PTN10 | 1.0E-11 | 1.0E+01 | 4.0E+01 | 4.0E+00 | 8.0E-03 | 1.0E+05 | 4.0E+01 | 5.0E-10 | 1.0E-07 | 1.0E-05 | 4.0E-01 | 1.0E-02 |
| PTN11 | 1.0E-11 | 1.0E+01 | 4.0E+01 | 4.0E+00 | 8.0E-02 | 1.0E+06 | 4.0E+01 | 5.0E-10 | 1.0E-08 | 1.0E-06 | 4.0E-01 | 1.0E-02 |
| PTN12 | 1.0E-11 | 1.0E+01 | 4.0E+01 | 4.0E+00 | 8.0E-01 | 1.0E+07 | 4.0E+01 | 5.0E-10 | 3.3E-09 | 1.0E-07 | 1.3E+00 | 3.3E-02 |
| PTN13 | 3.3E-11 | 3.0E+01 | 4.0E+01 | 1.2E+01 | 4.8E-02 | 1.0E+05 | 1.2E+02 | 1.0E-09 | 1.0E-06 | 1.0E-05 | 1.2E+01 | 1.0E-01 |
| PTN14 | 3.3E-11 | 3.0E+02 | 4.0E+01 | 1.2E+01 | 4.8E-01 | 1.0E+06 | 1.2E+02 | 1.0E-09 | 3.0E-07 | 1.0E-06 | 3.6E+01 | 3.0E-01 |
| PTN15 | 1.0E-10 | 1.0E+01 | 4.0E+01 | 4.0E+00 | 1.6E-02 | 1.0E+05 | 4.0E+01 | 1.0E-09 | 1.0E-07 | 1.0E-05 | 4.0E-01 | 1.0E-02 |
| PTN16 | 1.0E-10 | 1.0E+01 | 4.0E+01 | 4.0E+00 | 1.6E-01 | 1.0E+06 | 4.0E+01 | 1.0E-09 | 1.0E-08 | 1.0E-06 | 4.0E-01 | 1.0E-02 |
| PTN17 | 1.0E-10 | 1.0E+01 | 4.0E+01 | 4.0E+00 | 1.6E+00 | 1.0E+07 | 4.0E+01 | 1.0E-09 | 1.0E-08 | 1.0E-07 | 4.0E+00 | 1.0E-01 |

[FIG. 25]
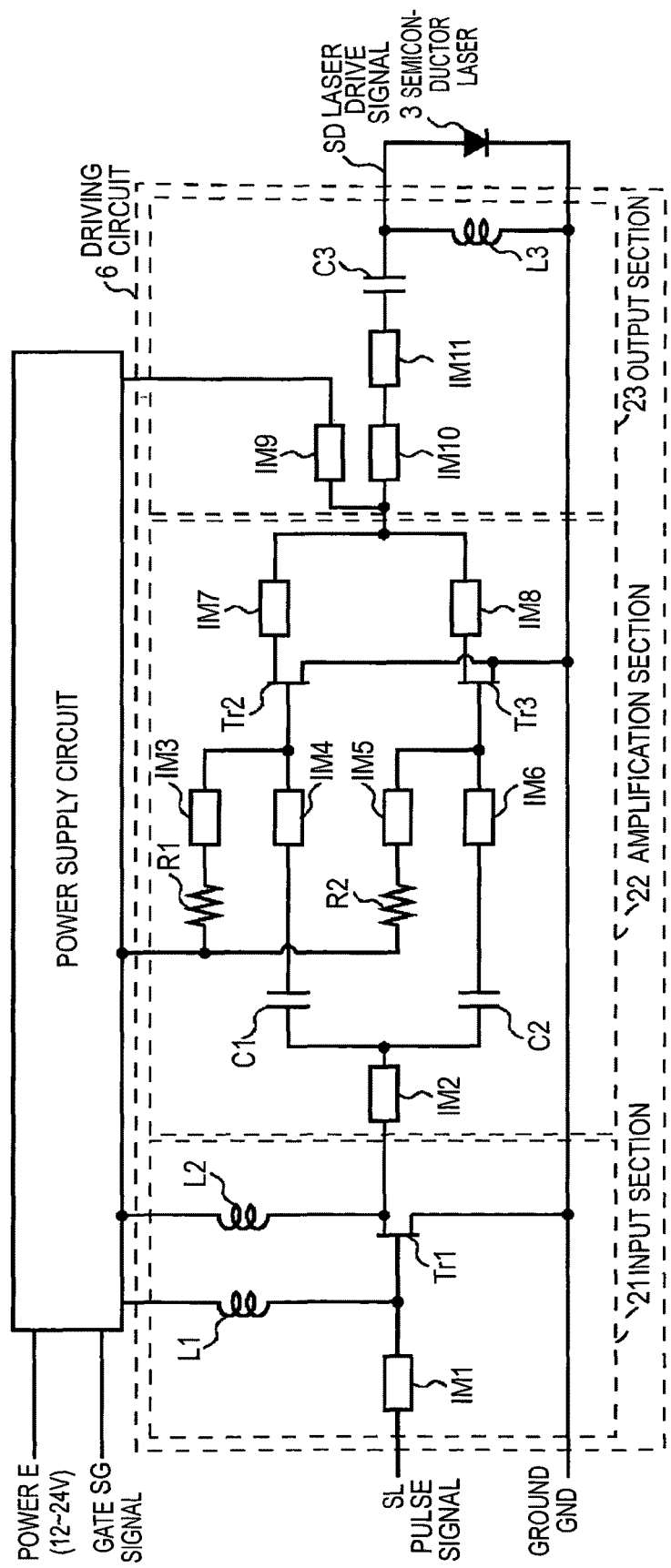

[FIG. 26]
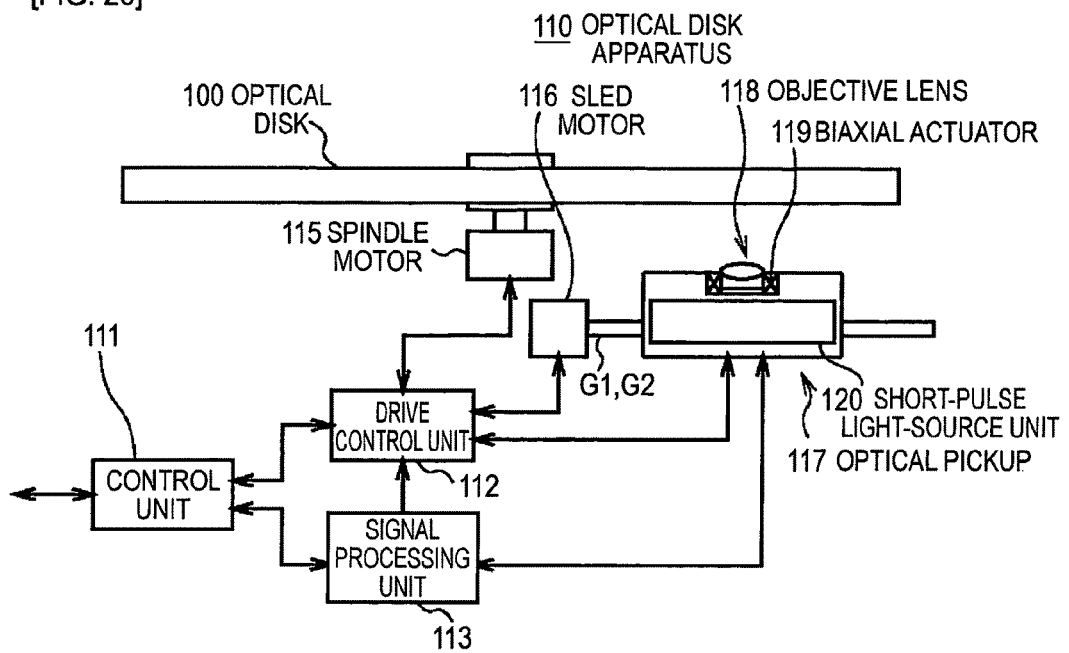
[FIG. 27]
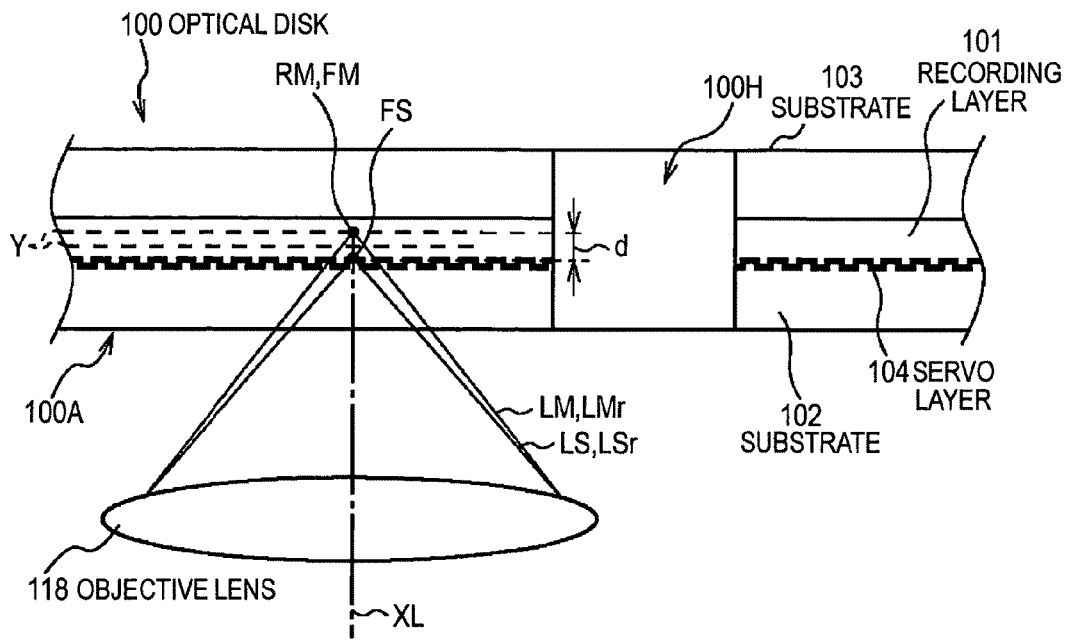

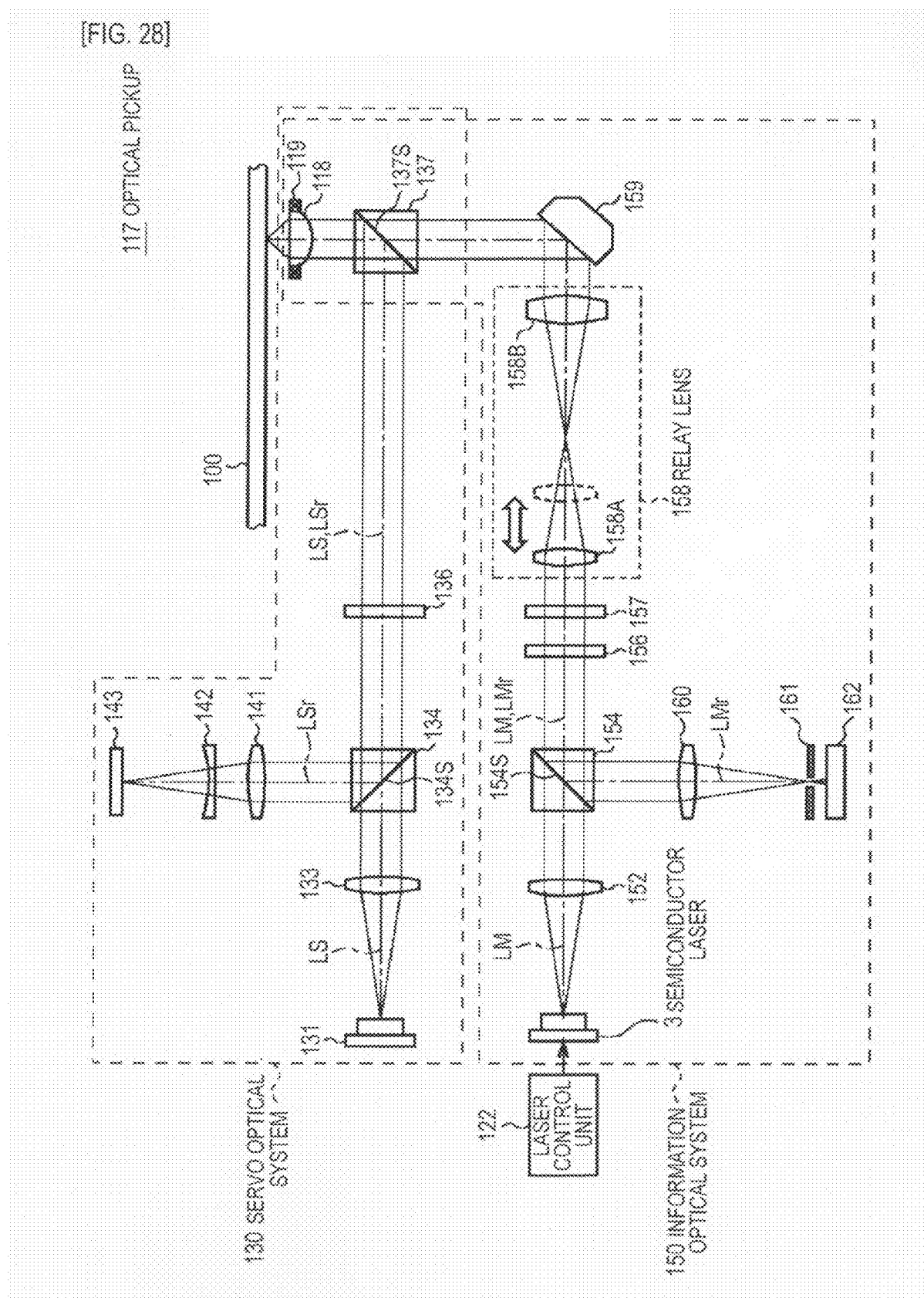

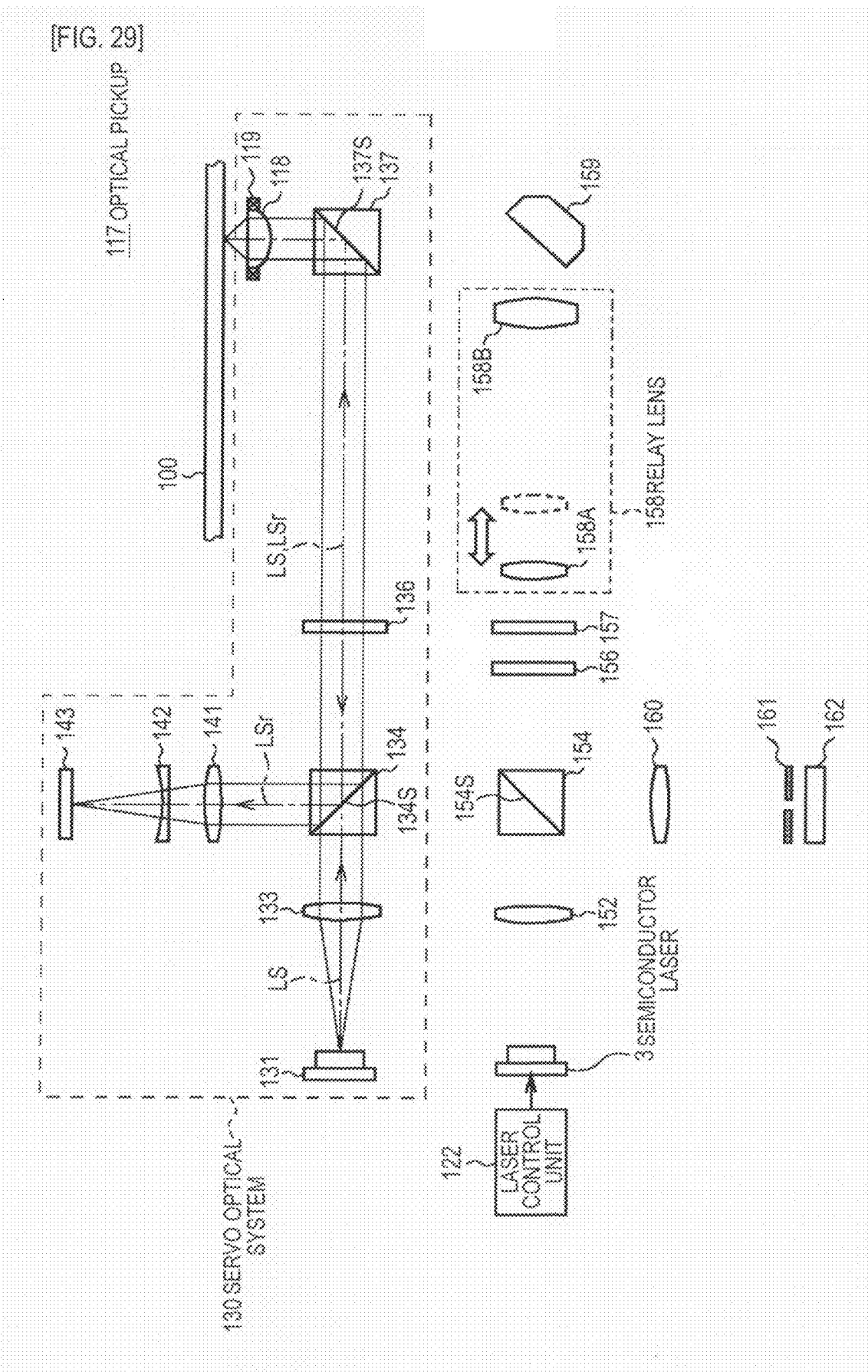
[FIG. 29]

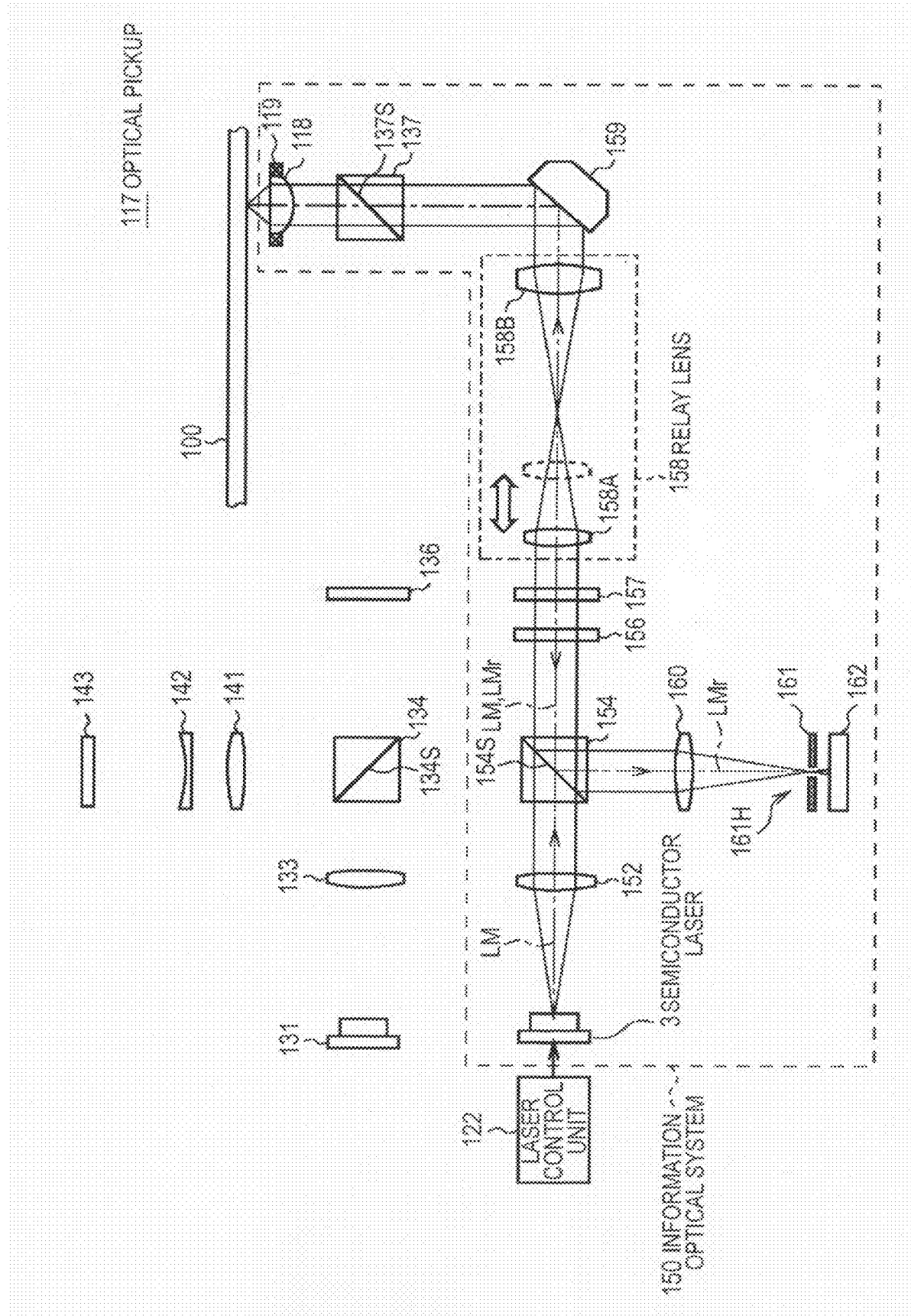
[FIG. 30]

[FIG. 31]
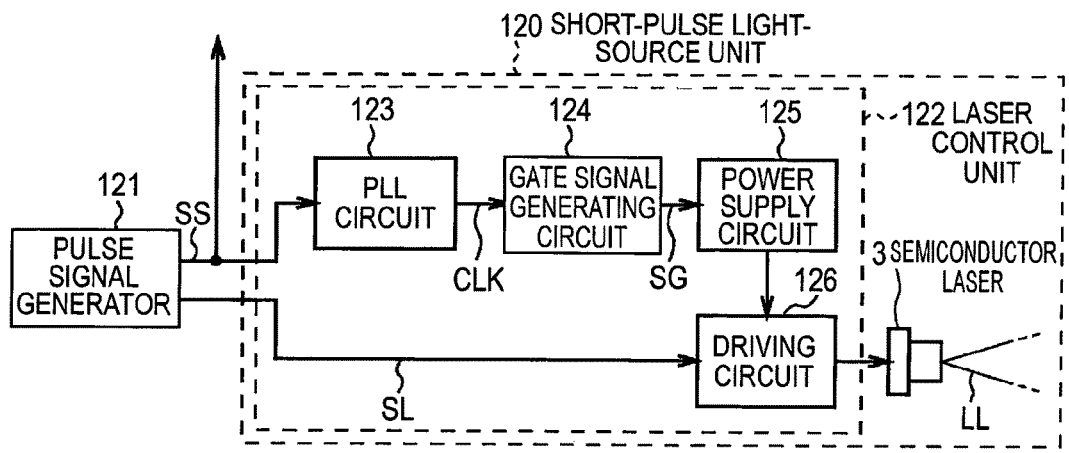
[FIG. 32]
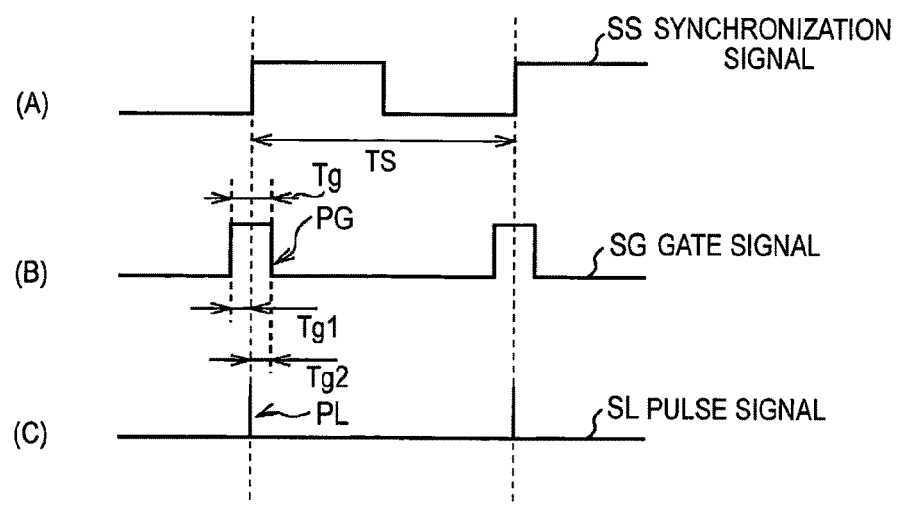

[FIG.33]
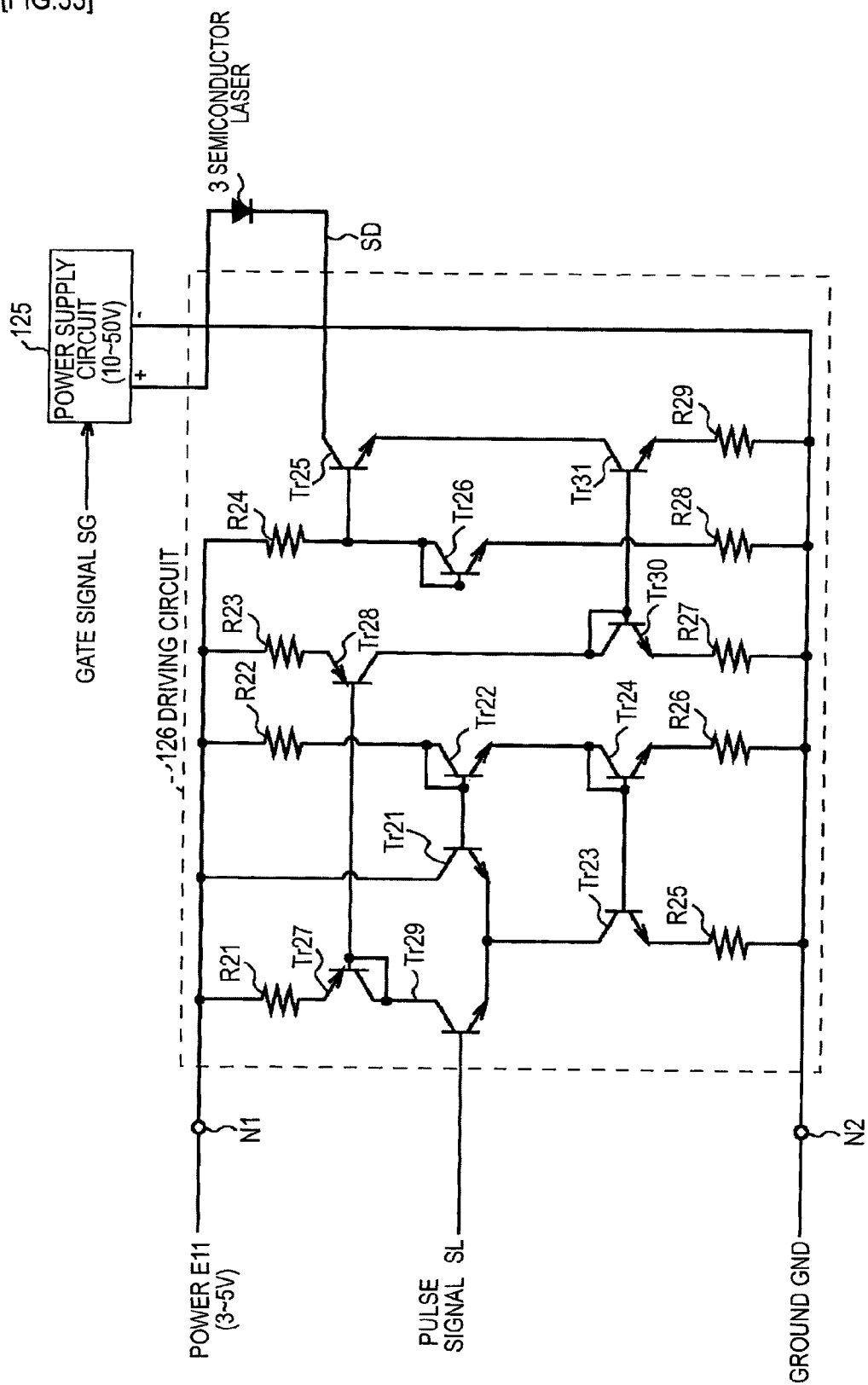

SHORT-PULSE LIGHT-SOURCE DEVICE, LASER DRIVING METHOD, OPTICAL PICKUP, AND OPTICAL DISC APPARATUS

RELATED APPLICATIONS

This application is the national stage filing 35 U.S.C. §371 of PCT International Application Ser. No. PCT/JP2009/067524, filed Oct. 1, 2009. This application also claims foreign priority benefits under 35 U.S.C. §119(a)-(d) or 35 U.S.C. §365(b) of Japan Application Ser. No. 2008-259109, filed Oct. 3, 2008. Each of the above applications is incorporated herein by reference.

TECHNICAL FIELD

The present invention relates to short-pulse light-source devices, laser driving methods, optical pickups, and optical disc apparatuses. The invention is suitable for, for example, an optical disc apparatus that records information in an optical disc using a light beam.

BACKGROUND ART

There has been widespread use of optical disc apparatuses that record and reproduce information in and from disc-shaped optical discs such as CDs (Compact Discs), DVDs (Digital Versatile Discs), and Blu-ray Discs® (hereinafter, "BD").

Such optical disc apparatuses use an optical disc to record various types of information, including content such as music content and video content, and various forms of computer data.

The recent development for higher resolution videos and higher sound quality for music has increased the amount of information, and thus the volume of content for recording in a single optical disc. Accordingly, there is a demand for larger-capacity optical discs.

In one proposed approach to increase the capacity of the optical disc, the recording pits as the representation of information are arranged three-dimensionally using a two-photon absorption reaction for their formation (see, for example, Patent Document 1).

Prior Art Documents
  Patent Document 1: JP-A-2005-37658
  Patent Document 2: JP-A-2008-71433

SUMMARY OF THE INVENTION

The two-photon absorption reaction is a phenomenon that occurs only in response to high-intensity light. This requires a high-intensity light source for the optical disc apparatus. An example of such a light source is a short-pulse light source, such as picosecond lasers and femtosecond lasers, that outputs a laser beam in short pulses. For example, titanium-sapphire lasers and YAG lasers are known.

However, because the short-pulse light source has large power consumption and requires a relatively powerful power supply circuit, the power supply circuit or other circuit elements such as a driving circuit used for the direct drive of the laser become relatively large in size.

In other words, because the installation of the short-pulse light source in the optical disc apparatus leads to large power consumption and presents difficulties in reducing the size of the power supply circuit, the driving circuit, or other elements of the short-pulse light source, a reduction in the size and weight of the entire optical disc apparatus is difficult to achieve.

The present invention has been made in view of these problems, and provides a short-pulse light-source device, a laser driving method, an optical pickup, and an optical disc apparatus that realize the emission of a high-output short-pulse beam and a reduction in power consumption.

In order to solve the foregoing problems, a short-pulse light-source device of the present invention is adapted to include:

a semiconductor laser that emits a laser beam in the form of a singular output beam having such light intensity characteristics as to include a pulsed singular peak and a singular slope of a smaller light intensity than that of the singular peak, the laser beam being emitted in response to a drive pulse supplied in pulses of a predetermined singular voltage;

a power supply circuit that acquires a gate signal containing a gate pulse indicative of a power supply timing, and that supplies or cuts power based on the gate pulse;

a driving circuit that acquires a pulse signal containing a control pulse indicative of an emission timing of the laser beam from the semiconductor laser, and that generates, using the power supplied from the power supply circuit, a laser drive signal containing the drive pulse that depends on the control pulse, and supplies the laser drive signal to the semiconductor laser; and a pulse signal generator that generates and supplies the pulse signal to the driving circuit, and that generates the gate signal in such a manner that the gate pulse rises to include at least a rise time of the control pulse in the pulse signal, and supplies the gate signal to the power supply circuit.

In this way, a short-pulse light-source device of the present invention can supply the necessary power for the generation of the drive pulse from the power supply circuit to the driving circuit and generate the laser drive signal at the timing of raising the drive pulse of the laser drive signal at the rise of the control pulse of the pulse signal. Thus, in the optical disc apparatus, the semiconductor laser can emit a short-pulse laser beam upon receiving the laser drive signal, and the power supply to the driving circuit can be cut when the drive pulse is not generated.

A laser driving method of the present invention is adapted to include:

a gate signal generating step of generating a gate signal containing a gate pulse indicative of a power supply timing, and supplying the gate signal to a predetermined power supply circuit;

a power supplying step of allowing the power supply circuit to supply or cut power based on the gate pulse;

a pulse signal generating step of generating a pulse signal in such a manner that a control pulse indicative of an emission timing of a laser beam from a predetermined semiconductor laser and having a pulse width equal to or shorter than the gate pulse rises within a rise time of the gate pulse in the gate pulse signal;

a laser drive signal generating step of generating a laser drive signal of a predetermined singular voltage and that contains the drive pulse dependant on the control pulse, the laser drive signal being generated based on the pulse signal in a driving circuit that receives the power from the power supply circuit; and a laser beam emitting step of supplying the laser drive signal to the semiconductor laser so as to allow the semiconductor laser to emit a singular output beam of such light intensity characteristics as to include a pulsed singular peak and a singular slope of a smaller light intensity than that of the singular peak.

In this way, a laser driving method of the present invention can supply the necessary power for the generation of the drive pulse from the power supply circuit to the driving circuit and generate the laser drive signal at the timing of raising the drive pulse of the laser drive signal at the rise of the control pulse of the pulse signal. Thus, in the optical disc apparatus, the semiconductor laser can emit a short-pulse laser beam upon receiving the laser drive signal, and the power supply to the driving circuit can be cut when the drive pulse is not generated.

A short-pulse light-source device of the present invention is adapted to include:

a semiconductor laser that emits a laser beam in the form of a singular output beam having such light intensity characteristics as to include a pulsed singular peak and a singular slope of a smaller light intensity than that of the singular peak, the laser beam being emitted in response to a drive pulse supplied in pulses of a predetermined singular voltage;

a driving circuit that acquires a pulse signal containing a control pulse indicative of an emission timing of the laser beam from the semiconductor laser, and that generates, based on the pulse signal, a laser drive signal containing the drive pulse that depends on the control pulse, and supplies the laser drive signal to the semiconductor laser; and a power supply circuit that acquires a gate signal in which a gate pulse indicative of a timing of supplying power to the driving circuit rises over a time period that includes a rise time of the control pulse in the pulse signal, and that supplies or cuts power to the driving circuit based on the gate signal.

In this way, a short-pulse light-source device of the present invention can supply the necessary power for the generation of the drive pulse from the power supply circuit to the driving circuit and generate the laser drive signal at the timing of raising the drive pulse of the laser drive signal at the rise of the control pulse of the pulse signal. Thus, in the optical disc apparatus, the semiconductor laser can emit a short-pulse laser beam upon receiving the laser drive signal, and the power supply to the driving circuit can be cut when the drive pulse is not generated.

A laser driving method of the present invention is adapted to include:

a gate signal acquiring step of acquiring a gate signal containing a gate pulse indicative of a power supply timing, and supplying the gate signal to a predetermined power supply circuit;

a power supplying step of allowing the power supply circuit to supply or cut power based on the gate pulse;

a pulse signal acquiring step of acquiring a pulse signal in which a control pulse indicative of an emission timing of a laser beam from a predetermined semiconductor laser and having a pulse width equal to or shorter than the gate pulse rises within a rise time of the gate pulse in the gate signal;

a laser drive signal generating step of generating a laser drive signal of a predetermined singular voltage and that contains the drive pulse dependant on the control pulse, the laser drive signal being generated based on the pulse signal in a driving circuit that receives the power from the power supply circuit; and a laser beam emitting step of supplying the laser drive signal to the semiconductor laser so as to allow the semiconductor laser to emit a singular output beam of such light intensity characteristics as to include a pulsed singular peak and a singular slope of a smaller light intensity than that of the singular peak.

In this way, a laser driving method of the present invention can supply the necessary power for the generation of the drive pulse from the power supply circuit to the driving circuit and generate the laser drive signal at the timing of raising the drive pulse of the laser drive signal at the rise of the control pulse of the pulse signal. Thus, in the optical disc apparatus, the semiconductor laser can emit a short-pulse laser beam upon receiving the laser drive signal, and the power supply to the driving circuit can be cut when the drive pulse is not generated.

An optical pickup of the present invention is adapted to include:

a semiconductor laser that emits a laser beam in the form of a singular output beam having such light intensity characteristics as to include a pulsed singular peak and a singular slope of a smaller light intensity than that of the singular peak, the laser beam being emitted in response to a drive pulse supplied in pulses of a predetermined singular voltage;

a power supply circuit that acquires a gate signal containing a gate pulse indicative of a power supply timing, and that supplies or cuts power based on the gate pulse;

a driving circuit that acquires a pulse signal containing a control pulse indicative of an emission timing of the laser beam from the semiconductor laser, and that generates, using the power supplied from the power supply circuit, a laser drive signal containing the drive pulse that depends on the control pulse, and supplies the laser drive signal to the semiconductor laser;

a pulse signal generator that generates and supplies the pulse signal to the driving circuit, and that generates the gate signal in such a manner that the gate pulse rises to include at least a rise time of the control pulse in the pulse signal, and supplies the gate signal to the power supply circuit; and an objective lens that condenses the emitted laser beam from the semiconductor laser to irradiate a predetermined optical disc.

In this way, an optical pickup of the present invention can supply the necessary power for the generation of the drive pulse from the power supply circuit to the driving circuit and generate the laser drive signal at the timing of raising the drive pulse of the laser drive signal at the rise of the control pulse of the pulse signal. Thus, in the optical disc apparatus, the semiconductor laser can emit a short-pulse laser beam upon receiving the laser drive signal, and the power supply to the driving circuit can be cut when the drive pulse is not generated.

An optical disc apparatus of the present invention is adapted to include:

a signal processor that generates record data that corresponds to a recording mark actually formed in a recording layer of an optical disc, the record data being generated according to information to be recorded in the optical disc;

a semiconductor laser that emits a laser beam in the form of a singular output beam having such light intensity characteristics as to include a pulsed singular peak and a singular slope of a smaller light intensity than that of the singular peak, the laser beam being emitted in response to a drive pulse supplied in pulses of a predetermined singular voltage;

a power supply circuit that acquires a gate signal containing a gate pulse indicative of a power supply timing, and that supplies or cuts power based on the gate pulse;

a driving circuit that acquires a pulse signal containing a control pulse indicative of an emission timing of the laser beam from the semiconductor laser, and that generates, using the power supplied from the power supply circuit, a laser drive signal containing the drive pulse that depends on the control pulse, and supplies the laser drive signal to the semiconductor laser;

a pulse signal generator that generates and supplies the pulse signal to the driving circuit, and that generates the gate signal in such a manner that the gate pulse rises to include at least a rise time of the control pulse in the pulse signal, and supplies the gate signal to the power supply circuit;

an objective lens that condenses the emitted laser beam from the semiconductor laser to irradiate the recording layer of the optical disc; and a condensed position controller that controls a condensed position of the laser beam in the recording layer of the optical disc.

In this way, an optical disc apparatus of the present invention can supply the necessary power for the generation of the drive pulse from the power supply circuit to the driving circuit and generate the laser drive signal at the timing of raising the drive pulse of the laser drive signal at the rise of the control pulse of the pulse signal. Thus, in the optical disc apparatus, the semiconductor laser can emit a short-pulse laser beam upon receiving the laser drive signal, and the power supply to the driving circuit can be cut when the drive pulse is not generated.

The present invention makes it possible to supply the necessary power for the generation of the drive pulse from the power supply circuit to the driving circuit and generate the laser drive signal at the timing of raising the drive pulse of the laser drive signal at the rise of the control pulse of the pulse signal. Thus, with the present invention, the semiconductor laser can emit a short-pulse laser beam upon receiving the laser drive signal, and the power supply to the driving circuit can be cut when the drive pulse is not generated. In this way, the present invention can realize a short-pulse light-source device, a laser driving method, an optical pickup, and an optical disc apparatus that realize the emission of a high-output short-pulse beam and a reduction in power consumption.

BRIEF DESCRIPTION OF THE DRAWINGS

FIG. 1 is an outlined line drawing illustrating a configuration of a short-pulse light-source device of a First Embodiment.

FIG. 2 is an outlined line drawing representing a pulse signal and a laser drive signal.

FIG. 3 is an outlined line drawing explaining the relationship between implanted carrier density and photon density.

FIG. 4 is an outlined line drawing explaining the relationship between implanted carrier density and carrier density.

FIG. 5 is an outlined line drawing explaining the relationship between implanted carrier density and photon density.

FIG. 6 is an outlined line drawing explaining the photon density in PT1.

FIG. 7 is an outlined line drawing explaining the photon density in PT2.

FIG. 8 is an outlined line drawing explaining the photon density in PT3.

FIG. 9 is an outlined line drawing representing the actual emission wavelength.

FIG. 10 is an outlined line drawing representing the relationship between drive signal and light intensity.

FIG. 11 is an outlined line drawing illustrating a configuration of a light measurement apparatus.

FIG. 12 is an outlined line drawing representing forms of pulses.

FIG. 13 is an outlined line drawing representing the relationship between pulse signal and drive pulse.

FIG. 14 is an outlined line drawing representing light intensity characteristics under varying voltages of the drive pulse.

FIG. 15 is an outlined line drawing representing a wavelength characteristic and a light intensity characteristic at the drive pulse voltage of 8.8 [V].

FIG. 16 is an outlined line drawing representing a wavelength characteristic and a light intensity characteristic at the drive pulse voltage of 13.2 [V].

FIG. 17 is an outlined line drawing representing a wavelength characteristic and a light intensity characteristic at the drive pulse voltage of 15.6 [V].

FIG. 18 is an outlined line drawing representing a wavelength characteristic and a light intensity characteristic at the drive pulse voltage of 17.8 [V].

FIG. 19 is an outlined line drawing representing a wavelength characteristic and a light intensity characteristic at the drive pulse voltage of 38.4 [V].

FIG. 20 is an outlined line drawing representing a difference in light intensity characteristics in the presence and absence of a BPF.

FIG. 21 is an outlined line drawing representing a difference in wavelength characteristics in the presence and absence of a BPF.

FIG. 22 is an outlined line drawing representing alight intensity characteristic of a singular output beam.

FIG. 23 is an outlined line drawing representing timings of signals according to the First Embodiment.

FIG. 24 is an outlined line drawing representing exemplary settings for cycle, pulse width, and other parameters, along with power consumption.

FIG. 25 is an outlined circuit diagram illustrating a configuration of a driving circuit according to the First Embodiment.

FIG. 26 is an outlined line drawing illustrating an overall configuration of an optical disc apparatus.

FIG. 27 is an outlined line drawing illustrating a configuration of an optical disc.

FIG. 28 is an outlined line drawing illustrating a configuration of an optical pickup.

FIG. 29 is an outlined line drawing illustrating a light path of a servo light beam.

FIG. 30 is an outlined line drawing illustrating a light path of an information light beam.

FIG. 31 is an outlined block diagram illustrating a configuration of a short-pulse light-source unit of a Second Embodiment.

FIG. 32 is an outlined line drawing representing timings of signals according to the Second Embodiment.

FIG. 33 is an outlined circuit diagram illustrating a configuration of a driving circuit of a Second Embodiment.

MODE FOR CARRYING OUT THE INVENTION

The best mode for carrying out the invention (hereinafter, "embodiments") are described below with reference to the accompanying drawings. The descriptions follow the following order.

1. First Embodiment (short-pulse light-source device, an example using a high-frequency circuit for the driving circuit)
2. Second Embodiment (optical disc apparatus, an example using a high-speed switch circuit for the driving circuit)
3. Other Embodiments

1. First Embodiment

[1-1. Configuration of Short-Pulse Light-Source Device]

FIG. 1 illustrates an overall configuration of a short-pulse light-source device 1 of the present embodiment. The short-pulse light-source device 1 is configured to include a laser control unit 2 and a semiconductor laser 3.

The semiconductor laser 3 is a common semiconductor laser that utilizes the emission of a semiconductor (for example, SLD3233; Sony Corporation). The laser control unit 2 is adapted to output a pulsed laser beam LL from the semiconductor laser 3 under the control of a drive signal D1 supplied to the semiconductor laser 3.

The laser control unit 2 is configured to include a pulse signal generator 4 that generates different kinds of pulse signals at predetermined timings, a power supply circuit 5 that generates power to drive the semiconductor laser 3, and a driving circuit 6 that drives the semiconductor laser 3 (described later in more detail).

The pulse signal generator 4 generates a synchronization signal SS of a rectangular wave with a predetermined cycle TSS. The pulse signal generator 4 operates at a timing based on the synchronization signal SS, and supplies the synchronization signal SS to external devices such as a measurement device (not illustrated).

Further, as illustrated in FIG. 2(A), the pulse signal generator 4 generates a pulse signal SL whose pulse varies in cycles TSS, and supplies the pulse signal SL to the driving circuit 6. The pulse signal SL is an indicator for the driving circuit 6, indicating the timing, duration, and voltage level of the power supplied to the semiconductor laser 3.

Based on the power and the pulse signal SL supplied from the power supply circuit 5, the driving circuit 6 generates a laser drive signal SD as represented in FIG. 2(B), and supplies it to the semiconductor laser 3.

Here, the driving circuit 6 generates the laser drive signal SD by amplifying the pulse signal SL with a predetermined amplification factor. Accordingly, the peak voltage VD of the laser drive signal SD varies according to the peak voltage VL of the pulse signal SL. Note that the waveform of the laser drive signal SD is distorted by the amplification characteristics of the driving circuit 6.

In response to the laser drive signal SD, the semiconductor laser 3 emits the laser beam LL by varying the light intensity LT in pulses, as represented in FIG. 2(C). In the following, the pulsed emission of the laser beam will be referred to as "pulsed output".

In this manner, the short-pulse light-source device 1 is operable to perform the direct pulsed output of the laser beam LL from the semiconductor laser 3 under the control of the laser control unit 2, without using other optical components.

[1-2. Pulsed Output of Laser Beam in Relaxation Oscillation Mode]

Generally, it is known to represent laser characteristics by the equation known as a rate equation. For example, the rate equation can be represented by the following equation (1)

$$\frac{dN}{dt} = -\Gamma GS - \frac{N}{\tau_s} + \frac{J}{dq} \quad (1)$$

$$\frac{dS}{dt} = \Gamma GS - \frac{S}{\tau_{ph}} + C_s \frac{N}{\tau_s}$$

where $$G = \frac{c}{n_g} A_g (N - N_0) = \frac{c}{n_g} g_{max}$$

where $\Gamma$ is the confinement factor, $\tau_{ph}$ the photon lifetime [s], $\tau_s$ the carrier lifetime [s], Cs the spontaneous emission coupling factor, d the active layer thickness [mm], q the elementary electric charge [C], $g_{max}$), the maximum gain, N the carrier density, S the photon density, J the implanted carrier density, c the speed of light [m/s], N0 the transparency carrier density, ng the group refractive index, and Ag the area.

Based on the rate equation (1), the relationship between implanted carrier density J and photon density S, and the relationship between implanted carrier density J and carrier density N were calculated. The results are shown in the graphs of FIGS. 3 and 4, respectively.

In these calculations, the confinement factor $\Gamma$=0.3, the photon lifetime $\tau$ph=1e$^{-12}$ [s], the carrier lifetime $\tau_s$=1e$^{-9}$ [s], the spontaneous emission coupling factor Cs=0.03, the active layer thickness d=0.1 [μm], the elementary electric charge q=1.6e$^{-19}$ [C], and the area Ag=3e$^{-16}$ [cm$^2$].

As represented in FIG. 4, a common semiconductor laser starts emission at a saturation point S1 slightly in advance of the saturation state of carrier density N, according to an increase in implanted carrier density J (specifically, the laser drive signal SD).

Further, as represented in FIG. 3, the semiconductor laser increases the photon density S (specifically, the light intensity) with increase in implanted carrier density J. Further, as represented in FIG. 5 analogous to FIG. 3, the semiconductor laser further increases the photon density S with further increase in implanted carrier density J.

In the characteristics curve of FIG. 5, points PT1 to PT3 were chosen, PT1 being the point of a relatively large implanted carrier density J, and PT2 and PT3 being the points of successively decreasing implanted carrier density J with respect to PT1.

FIG. 6, FIG. 7, and FIG. 8 show the results of calculation representing changes in photon density S after the application of laser drive signal SD at points PT1, PT2, and PT3, respectively. The magnitude of the implanted carrier density J corresponds to the magnitude of the laser drive signal SD supplied to the semiconductor laser. The magnitude of the photon density S corresponds to the magnitude of light intensity.

As represented in FIG. 6, at point PT1, the photon density S was shown to undergo large oscillations by the phenomenon known as relaxation oscillation and to increase its amplitude. It was also found that the oscillation cycle TSa (amplitude cycle; from a local minimum to another local minimum) was as small as about 60 [ps]. The photon density S has the largest value for the amplitude of the first wave that occurs immediately after the start of emission, and gradually attenuates to the second wave and the third wave before it stabilizes.

The maximum value of the first wave of the photon density S at point PT1 was about 3×10$^{16}$, about three times greater than the stable value (about 1×10$^{16}$) of the photon density S after stabilization.

Here, when the time to start emission after the application of the laser drive signal SD is the emission start time $\tau$d, the emission start time $\tau$d can be calculated from the rate equation (1).

Specifically, when the photon density S=0 prior to oscillation, the upper equation in (1) can be represented as follows.

$$\frac{dN}{dt} = \frac{N}{\tau_s} + \frac{J}{dq} \quad (2)$$

When the carrier density N is the threshold $N_{th}$, the emission start time $\tau d$ can be represented as follows.

$$\tau d = \tau_s N_{th} \frac{J_{th}}{J} \quad (3)$$

where $$J_{th} = \frac{dq}{\tau_s} N_{th}$$

It can be seen that the emission start time $\tau d$ is inversely proportional to implanted carrier density J.

As represented in FIG. 6, at point PT1, the emission start time $\tau d$ is calculated as about 200 [ps] from equation (3). At point PT1, the laser drive signal SD of a large voltage value has been applied to the semiconductor laser, and accordingly the emission start time $\tau d$ to start emission after the application of the laser drive signal SD is short.

As represented in FIG. 7, at point PT2 having a smaller value of laser drive signal SD than point PT1, the oscillation amplitude is smaller than at point PT1, and the oscillation cycle TSa has a larger value of about 100 [ps], even though relaxation oscillation is clearly present.

Further, at point PT2, the emission start time $\tau d$ was calculated as about 400 [ps] from equation (3), a value greater than that at point PT1. The maximum value of the first wave of the photon density S was about $8 \times 10^{15}$ at point PT2, about twice as large as the stable value (about $4 \times 10^{15}$).

As represented in FIG. 8, relaxation oscillation was hardly seen at point PT3 having an even smaller value of the supplied laser drive signal SD than point PT2. Further, at point PT3, the emission start time $\tau d$ was shown to be relatively long, specifically about 1 [ns] as calculated from equation (3). The maximum value of the photon density S at point PT3 was about $1.2 \times 10^{15}$, about the same as the stable value.

In common laser light sources, a laser drive signal SD of a relative low voltage that shows almost no relaxation oscillation is applied to the semiconductor laser as in point PT3. Specifically, common laser light sources are designed to stabilize the output of the laser beam LL by suppressing the fluctuation range of light intensity immediately after the start of laser beam emission.

In the following, the operation mode of the short-pulse light-source device 1 in which a laser drive signal SD of a relatively low voltage is supplied to the semiconductor laser 3 to output the laser beam LL at a stable light intensity without relaxation oscillation is referred to as the "normal mode". In the normal mode, the voltage of the laser drive signal SD supplied to the semiconductor laser 3 will be referred to as the "normal voltage VN", and the output laser beam LL from the semiconductor laser 3 will be referred to as the "normal output beam LN".

The short-pulse light-source device 1 of the present embodiment also has the operation mode in which a laser drive signal SD of a relatively high voltage is supplied as in point PT1 and PT2 to produce relaxation oscillation in the light intensity characteristics (hereinafter, "relaxation oscillation mode").

In the relaxation oscillation mode, the short-pulse light-source device 1 increases the voltage V of the laser drive signal SD (hereinafter, "oscillation voltage VB") more than the normal voltage VN (for example, 1.5 times of more). As a result, the short-pulse light-source device 1 can increase the maximum value of the instantaneous light intensity LT of the laser beam more than in the normal mode.

Specifically, the short-pulse light-source device 1, when operating in the relaxation oscillation mode, supplies a relatively high oscillation voltage VB to the semiconductor laser 3 to produce the emission of the light beam LL of a high intensity according to the oscillation voltage VB.

From a different viewpoint, the semiconductor laser 3 with the applied laser drive signal SD of oscillation voltage VB can greatly increase the light intensity of the laser beam LL more than in the application of normal voltage VN.

For example, at point PT1, the semiconductor laser has a photon density S of about $3 \times 10^{16}$ in the first wave undergoing relaxation oscillation, an at least 20-fold increase in the light intensity of the semiconductor laser 3 compared with the photon density S (about $1.2 \times 10^{15}$) at point PT3 indicative of the application of normal voltage VN.

FIG. 9 represents a waveform of light intensity characteristics actually measured with the application of a laser drive signal SD of a relative high voltage to a common semiconductor laser (SLD3233VF; Sony Corporation). Note that the waveform represented in FIG. 9 is the waveform of light intensity characteristics of the laser beam LL obtained by supplying a laser drive signal SD of a rectangular pulse to the semiconductor laser.

The result shown in FIG. 9 confirmed that the relaxation oscillation obtained as the calculation result for photon density S in FIG. 6 and FIG. 7 is actually manifested as changes in light intensity.

In the following, detailed assessment is made as to the relationship between the laser drive signal SD supplied to the semiconductor laser 3 and the light intensity of the laser beam LL.

FIG. 10(A) represents changes in photon density S with time, as in FIG. 7. For example, as represented in FIG. 10(B), the laser control unit 2 of the short-pulse light-source device 1 supplies a pulsed laser drive signal SD of an oscillation voltage VB1 sufficient to produce relaxation oscillation to the semiconductor laser 3.

Here, the laser control unit 2 produces a rectangular pulse signal by raising the laser drive signal SD from low level to high level over a time period including the emission start time $\tau d$ plus the oscillation cycle TSa of relaxation oscillation ($\tau d + ta$; hereinafter, "supply time $\tau PD$").

For ease of explanation, the raised pulse portion of the laser drive signal SD will be referred to as the "drive pulse PD1".

As a result, the semiconductor laser 3 is able to emit the pulsed laser beam LL (hereinafter, "oscillation output beam LB) that corresponds to only the first wave portion of the relaxation oscillation, as represented in FIG. 10(C).

Here, because the laser control unit 2 supplies the pulsed drive pulse PD, the application time of the high oscillation voltage VB can be confined in a relatively short period, making it possible to reduce the average power consumption of the semiconductor laser 3 and thereby prevent malfunctions or destruction of the semiconductor laser 3 due to overheating.

Further, as represented in FIG. 10(D), the laser control unit 2 is also adapted to supply to the semiconductor laser 3a drive pulse PD2 of an oscillation voltage VB2 sufficiently large to produce relaxation oscillation but smaller than the oscillation voltage VB1.

In this case, as represented in FIG. 10(E), the semiconductor laser 3 can emit an oscillation output beam LB of a light intensity smaller than when the drive pulse PD1 is supplied.

In this manner, the short-pulse light-source device 1 is adapted to operate in the relaxation oscillation mode in which the laser control unit 2 supplies the drive pulse PD (drive pulse PD1 or PD2) of a relatively large oscillation voltage VB to the semiconductor laser 3. Here, the short-pulse light-source device 1 emits the oscillation output beam LB whose light intensity varies in pulses according to the relaxation oscillation.

[1-3. Pulsed Output of Laser Beam in a Singular Mode]

In addition to the normal mode and the relaxation oscillation mode, the short-pulse light-source device 1 is also operable in a singular mode in which a drive pulse PD of a singular voltage VE higher than the oscillation voltage VB is supplied to the semiconductor laser 3.

Here, the short-pulse light-source device 1 performs the pulsed output of the laser beam LL of greater light intensity than the oscillation output beam LB from the semiconductor laser 3.

[1-3-1. Configuration of Light Measurement Apparatus]

An experiment to measure the light intensity of the laser beam LL with varying voltages V of the drive pulse PD in the short-pulse light-source device 1 was conducted using a light measurement apparatus 11 (FIG. 11) that measures and analyzes the laser beam LL emitted from the short-pulse light-source device 1.

The light measurement apparatus 11 causes the semiconductor laser 3 of the short-pulse light-source device 1 to emit the laser beam LL, and the emitted light is incident on a collimating lens 12.

Then, in the light measurement apparatus 11, a collimating lens 12 converts the laser beam LL from divergent rays to parallel rays. The light is incident on a condensing lens 15, and condensed by the condensing lens 15.

The laser beam LL in the light measurement apparatus 11 is then supplied to an optical sample oscilloscope 16 (C8188-01; Hamamatsu Photonics K.K.), and the light intensity of the laser beam LL is measured to represent changes in light intensity over time as light intensity characteristics UT (described later).

The laser beam LL in the light measurement apparatus 11 is also supplied to a light spectrum analyzer 17 (Q8341; ADC Corporation), and the wavelength of the laser beam LL is analyzed to represent distribution characteristics as wavelength characteristics UW (described later).

The light measurement apparatus 11 also includes a power meter 14 (Q8230; ADC Corporation) between the collimating lens 12 and the condensing lens 15. The power meter 14 measures the light intensity LT of the laser beam LL.

Further, the light measurement apparatus 11 optionally includes a BPF (Band Pass Filter) 13 between the collimating lens 12 and the condensing lens 15, as needed. The BPF 13 can reduce the transmittance of a specific wavelength component of the laser beam LL.

[1-3-2. Relationship between Setting Pulse and Drive Pulse]

In the short-pulse light-source device 1, signals such as the pulse signal SL and the laser drive signal SD are high-frequency signals, and as such the waveforms of these signals are expected to deform from ideal rectangular waves, and become "rounded" waveforms.

Thus, as illustrated in FIG. 12(A), the pulse signal generator 4 is adapted to output a pulse signal SL that contains a rectangular setting pulse PLs having a pulse width Ws of 1.25 [ns]. The pulse signal SL was measured with a predetermined measurement device, and the result as shown in FIG. 12(B) was obtained.

In the pulse signal SL of FIG. 12(B), the generated signal pulse half width PLhalf, a half width of the generated pulse (hereinafter, "generated pulse PL") corresponding to the setting pulse PLs, was about 1.5 [ns].

Measurement was also performed for the laser drive signal SD actually supplied to the semiconductor laser 3 from the driving circuit 6 upon supply of the pulse signal SL from the pulse signal generator 4 to the driving circuit 6. The result is shown in FIG. 12(C).

In the laser drive signal SD, the drive pulse half width PDhalf, a half width of the pulse (drive pulse PD) corresponding to the generated pulse PL, varied from about 1.5 [ns] to about 1.7 [ns] according to the signal level of the generated pulse PL.

FIG. 13 represents the relation of the drive pulse half width PDhalf of the drive pulse PD plotted against the maximum voltage valve of generated pulse PL, and the maximum voltage value Vmax of the drive pulse PD plotted against the maximum voltage value of generated pulse PL.

It can be seen from FIG. 13 that the maximum voltage value Vmax of the drive pulse PD in the output laser drive signal SD from the driving circuit 6 increases with increase in the maximum voltage value of the generated pulse PL supplied to the driving circuit 6.

It can also be seen from FIG. 13 that the drive pulse half width PDhalf of the drive pulse PD gradually increases with increase in the maximum voltage value of the generated pulse PL supplied to the driving circuit 6.

In other words, the short-pulse light-source device 1 can vary the pulse width and the voltage value of the drive pulse PD in the output laser drive signal SD from the driving circuit 6 by varying the maximum voltage value of the generated pulse PL supplied to the driving circuit 6, even when the setting pulse PLs of a certain pulse width is set in the pulse signal generator 4.

[1-3-3. Relationship between Drive Pulse Voltage and Output Laser Beam]

The light intensity of the output laser beam LL from the semiconductor laser 3 according to the drive pulse PD was measured under varying maximum voltage values Vmax of the drive pulse PD, using the optical sample oscilloscope 16 of the light measurement apparatus 11 (FIG. 11).

FIGS. 14(A) and 14(B) show the results of measurement. In FIG. 14, the time axis (horizontal axis) represents relative time, not absolute time. Further, the BPF 13 was not used in the measurement.

As represented in FIG. 14(A), at the drive pulse PD maximum voltage value Vmax of 8.8 [V], only one small output peak (in the vicinity of 1,550 [ps]) of a relatively wide width was confirmed in the light intensity characteristic UT1 of the laser beam LL, and oscillations due to relaxation oscillation were not observed. In other words, the light intensity characteristic UT1 indicates that the short-pulse light-source device 1 is operating in the normal mode, and that the semiconductor laser 3 has output the normal output beam LN.

Further, as represented in FIG. 14(A), at the drive pulse PD maximum voltage value Vmax of 13.2 [V], a plurality of peaks due to relaxation oscillation was observed in the light intensity characteristic UT2 of the laser beam LL. In other words, the light intensity characteristic UT2 indicates that the short-pulse light-source device 1 is operating in the relaxation oscillation mode, and that the semiconductor laser 3 has output the oscillation output beam LB.

On the other hand, as represented in FIG. 14(B), at the drive pulse PD maximum voltage values Vmax of 17.8 [V], 22.0 [V], 26.0 [V], and 29.2 [V], a peak portion appearing relatively early as a leading peak, and a slope portion that gradually attenuates with small, rapid oscillations were observed in the light intensity characteristics UT3, UT4, UT5, and UT6 of the laser beam LL.

The light intensity characteristics UT3, UT4, UT5, and UT6, with the absence of a large peak following the leading peak portion, have clearly different waveform patterns compared with the light intensity characteristic UT2 (FIG. 14(A)) in the relaxation oscillation mode having the second and third wave peaks after the first wave.

Of note, a separate experiment using a streak camera confirmed that the peak width (half width) of the leading peak portion was about 10 [ps]. This does not appear in FIG. 14 and elsewhere because the resolution of the optical sample oscilloscope 16 of the light measurement apparatus 11 is only about 30 [ps] or more.

Because of the low resolution of the optical sample oscilloscope 16, it may not always be possible to produce accurate results in the measurement of light intensity LT with the light measurement apparatus 11. Where there is such error, the maximum light intensity of the leading peak portion presented in FIG. 14 and elsewhere appears smaller than the actual value.

The following is a further analysis of the laser beam LL under varying maximum voltage values Vmax of the drive pulse PD.

Using the light measurement apparatus 11, the laser beam LL emitted from the semiconductor laser 3 under varying maximum voltage values Vmax of the drive pulse PD was measured with respect to the light intensity characteristics UT and wavelength characteristics UW, using the optical sample oscilloscope 16 and the light spectrum analyzer 17, respectively.

FIG. 15 to FIG. 19 show the results of measurement. FIG. 15(A) to FIG. 19(A) represent the wavelength characteristics UW of the laser beam LL measured with the light spectrum analyzer 17 (results resolved by wavelength). FIG. 15(B) to FIG. 19(B) represent the light intensity characteristics UT of the laser beam LL measured with the optical sample oscilloscope 16 as in FIG. 14 (changes over time). The BPF 13 was not used in the measurements.

As represented in FIG. 15(B), at the drive pulse PD maximum voltage value Vmax of 8.8 [V], only one peak was confirmed in the waveform in the light intensity characteristic UT11 of the laser beam LL. This indicates that the short-pulse light-source device 1 is operating in the normal mode, and that the laser beam LL is a normal output beam LN.

Further, as represented in FIG. 15(A), only one peak was confirmed in the wavelength characteristic UW11 at the wavelength of about 404 [nm]. This shows that the laser beam LL has the wavelength of about 404 [nm].

As represented in FIG. 16(B), at the drive pulse PD maximum voltage value Vmax of 13.2 [V], a plurality of large peaks was confirmed in the light intensity characteristic UT12 of the laser beam LL. This indicates that the short-pulse light-source device 1 is operating in the relaxation oscillation mode, and that the laser beam LL is an oscillation output beam LB.

Further, as represented in FIG. 16(A), two peaks were confirmed in the wavelength characteristic UW12 at the wavelengths of about 404 [nm] and about 407 [nm]. This shows that the laser beam LL has the wavelengths of about 404 [nm] and about 407 [nm].

As represented in FIG. 17(B), at the drive pulse PD maximum voltage value Vmax of 15.6 [V], a leading peak portion and a gradually attenuating slope portion were observed in the light intensity characteristic UT13 of the laser beam LL.

Here, as represented in FIG. 17(A), two peaks were confirmed in the wavelength characteristic UW13 at the wavelengths of about 404 [nm] and about 408 [nm]. In the wavelength characteristic UW13, the about 406 [nm] peak confirmed in the relaxation oscillation mode has shifted 2 [nm] toward the longer wavelength side, and the portion in the vicinity of 398 [nm] had a slight bulge.

As represented in FIG. 18(B), at the drive pulse PD maximum voltage value Vmax of 17.8 [V], a leading peak portion and a gradually attenuating slope portion were observed in the light intensity characteristic UT14 of the laser beam LL.

Further, as represented in FIG. 18(A), two large peaks were confirmed in the wavelength characteristic UW14 at the wavelengths of about 398 [nm] and about 403 [nm]. The wavelength characteristic UW14 had a peak at about 408 [nm], but it was considerably smaller than its counterpart in the wavelength characteristic UW13 (FIG. 17(A)). Instead, a large peak was observed at about 398 [nm].

As represented in FIG. 19(B), at the drive pulse PD maximum voltage value Vmax of 38.4 [V], a leading peak portion and a gradually attenuating slope portion were clearly observed in the light intensity characteristic UT15 of the laser beam LL.

Further, as represented in FIG. 19(A), two peaks were observed in the wavelength characteristic UW15 at the wavelengths of about 398 [nm] and about 404 [nm]. In the wavelength characteristic UW15, the about 408 [nm] peak observed in the wavelength characteristic UW14 (FIG. 18(A)) was absent, and a clear peak was formed at about 398 [nm].

Taken together, it was confirmed that the short-pulse light-source device 1 can output the laser beam LL having different waveforms and different wavelengths from the oscillation output beam LB with the drive pulse PD of a singular voltage VE (maximum voltage value Vmax), greater than the oscillation voltage VB, supplied to the semiconductor laser 3. The emission start time τd of the laser beam LL did not coincide with that derived from equation (3).

Looking at the wavelength, the laser beam LL varies form the normal output beam LN (FIG. 15) to the oscillation output beam LB (FIG. 16) as the maximum voltage value Vmax increases, and its wavelength varies from the oscillation output beam LB.

Specifically, the oscillation output beam LB (FIG. 16) in its wavelength characteristic UW12 has a peak at about the same wavelength as in the normal output beam LN (within ±2 [nm] from the wavelength of the normal output beam LN), and another peak about 3 [nm] toward the longer wavelength side from the normal output beam LN (within 3±2 [nm]).

On the other hand, the wavelength characteristic UW15 of the laser beam LL represented in FIG. 19 has a peak at about the same wavelength as in the normal output beam LN (within ±2 [nm] from the wavelength of the normal output beam LN), and another peak about 6 [nm] toward the shorter wavelength side from the normal output beam LN (within 6±2 [nm]).

Thus, in the following, the laser beam LL as represented in FIG. 19 will be referred to as a "singular output beam LE", and the operation mode of the short-pulse light-source device 1 outputting the singular output beam LE from the semiconductor laser 3 will be referred to as a "singular mode".

[1-3-4. Wavelength of Laser Beam in a Singular Mode]

By comparing the wavelength characteristic UW13 (FIG. 17(A)) at the maximum voltage value Vmax of 15.6 [V] with the wavelength characteristic UW14 (FIG. 18(A)) at the maximum voltage value Vmax of 17.8 [V], it can be seen that the peak on the longer wavelength side has disappeared, and a peak has appeared on the shorter wavelength side.

Specifically, it can be seen in the wavelength characteristic UW that the peak on the longer wavelength side gradually decreases and the peak on the shorter wavelength side increases instead as the laser beam LL changes from the oscillation output beam LB to the singular output beam LE with increase in the maximum voltage value Vmax.

Accordingly, in the following, the laser beam LL of such a wavelength characteristic UW that the peak area on the shorter wavelength side is equal to or greater than the peak area on the longer wavelength side will be regarded as the singular output beam LE, whereas the laser beam LL of such a wavelength characteristic UW that the peak area on the shorter wavelength side is smaller than the peak area on the longer wavelength side will be regarded as the oscillation output beam LB.

In cases where the two peaks overlap as in FIG. 18, the wavelength 6 [nm] toward the shorter wavelength side from the wavelength of the normal output beam LN is defined as the center wavelength of the shorter wavelength side, and the area ±3 [nm] of the center wavelength is defined as the peak area.

According to these definitions, the laser beam LL (FIG. 17) becomes an oscillation output beam LB at the maximum voltage value Vmax of 15.6 [V], and the laser beam LL (FIG. 18) becomes a singular output beam LE at the maximum voltage value Vmax of 17.8 [V].

Next, the short-pulse light-source device 1 was operated in the singular mode, and the light intensity characteristic UT16 and the wavelength characteristic UW16 of the light beam LL (singular output beam LE) were measured with the light measurement apparatus 11. Further, with the BPF 13 installed in the light measurement apparatus 11, the light intensity characteristic UT17 and the wavelength characteristic UW17 were measured in the same manner under a reduced transmittance of the light beam LL for the wavelength of 406±5 [nm].

FIG. 20 is an overlaid representation of the light intensity characteristic UT16 and the light intensity characteristic UT17. As can be seen in FIG. 20, the light intensity characteristic UT17 measured with the BPF 13 had almost the same light intensity as the light intensity characteristic UT16 at the peak portion. However, the light intensity was considerably smaller at the slope portion.

The reduction in light intensity at the slope portion is due to the BPF 13 acting on the wavelength of about 404 [nm] in the slope portion, whereas the reduction in light intensity due to the BPF 13 is not seen in the peak portion because the wavelength is about 398 [nm] in this portion.

FIGS. 21(A) and 21(B) represent the wavelength characteristics UW16 and UW17, respectively. In FIG. 21, the wavelength characteristics UW16 and UW17 have been normalized according to their respective maximum light intensities. The light intensity on the vertical axis is a relative value.

In the wavelength characteristic UW16 (FIG. 21(A)), the light intensity at the wavelength 404 [nm] is greater than the light intensity at the wavelength 398 [nm], corresponding to the large-area slope portion of the light intensity characteristic UT16.

On the other hand, in the wavelength characteristic UW17, the light intensity is about the same at the wavelengths 404 [nm] and 398 [nm] because of the smaller slope portion.

These results show that the singular output beam LE has a wavelength of about 404 [nm] for the singular slope ESL and a wavelength of about 398 [nm] for the singular peak EPK in the light intensity characteristic UT represented in FIG. 22; specifically, the wavelength was found to be shorter in the peak portion than in the slope portion.

In other words, the peak portion in the light intensity characteristic UT of the singular output beam LE has the wavelength shifted about 6 [nm] toward the shorter wavelength side compared with the normal output beam LN. Note that experiments using semiconductor lasers having different wavelengths for the normal output beam LN yielded similar results.

Further, the singular output beam LE was measured using SLD3233 (Sony Corporation) as the semiconductor laser 3 for the light measurement apparatus 11. As a result, the light intensity characteristic UT20 as represented in FIG. 22 was obtained.

The light intensity in the peak portion of the singular output beam LE (hereinafter, "singular peak EPK") was about 12 [W] as measured by the power meter 14. It can be said that the light intensity of about 12 [W] is considerably larger than the maximum light intensity (about 1 to 2 [W]) of the oscillation output beam LB. Note that such light intensity does not appear in FIG. 22 because of the low resolution of the optical sample oscilloscope 16.

Further, the result of analysis using a streak camera (not illustrated) confirmed that the light intensity characteristic UT of the singular output beam LE has a peak width of about 10 [ps] at the singular peak EPK, a value smaller than the peak width (about 30 [ps]) of the oscillation output beam LB. Note that such a peak width does not appear in FIG. 22 because of the low resolution of the optical sample oscilloscope 16.

On the other hand, the slope portion in the light intensity characteristic UT of the singular output beam LE (hereinafter, "singular slope ESL") had the same wavelength as the laser beam LL of the normal mode, and the maximum light intensity of about 1 to 2 [W].

In this manner, by supplying the laser drive signal SD of the singular voltage VE higher than the oscillation voltage VB to the semiconductor laser 3, the short-pulse light-source device 1 can emit the singular output beam LE of such a light intensity characteristic UT that the singular peak EPK and the singular slope ESL appear sequentially.

[1-4. Configuration of Laser Control Unit]

The laser control unit 2 (FIG. 1) of the short-pulse light-source device 1 is described below in detail.

[1-4-1. Signal Timing]

The pulse signal generator 4 of the laser control unit 2 is adapted to generate the synchronization signal SS of a rectangular wave with a predetermined cycle TSS, as represented in FIG. 23(A). The synchronization signal SS is a rectangular wave of an about 50% duty ratio, and serves as the reference of the operation timing for the entire operation of the short-pulse light-source device 1.

The pulse signal generator 4 also generates a pulse gate signal SG as represented in FIG. 23(B), and supplies it to the power supply circuit 5. The gate signal SG is a signal with recurring rectangular gate pulses PG of a pulse width Tg generated in the cycle TS of the synchronization signal SS. The gate pulse PG rises in synchronism with the rising edge of the synchronization signal SS.

Further, the gate signal SG indicates that power be supplied from the power supply circuit 5 to the driving circuit 6 only during the high level period, specifically the time period corresponding to the pulse width Tg in the cycle TS.

The pulse signal generator 4 also generates the pulse signal SL in which the generated pulse PL as the control pulse rises in each cycle TS, as represented in FIG. 23(C) analogous to FIG. 2(A), and supplies the pulse signal SL to the driving circuit 6. The pulse width Tu of the pulse signal SL is extremely short, for example, about 1 [ns] or about 500 [ps].

The pulse signal SL is produced in such a manner that the generated pulse PL rises after a delay time Tp with respect to the rise timing of the synchronization signal SS.

The delay time Tp is set to be shorter than the pulse width Tg of the gate pulse PG in the gate signal SG. Specifically, in the pulse signal SL, the generated pulse PL rises at the timing within the pulse width Tg of the gate pulse PG in the gate signal SG. In other words, the gate pulse PG leads the generated pulse PL in terms of the rise phase.

In the laser control unit 2, the gate pulse PG needs to be high at least at the rise of the generated pulse PL, and is not required to be high at other times.

It is assumed here that the power consumption of the driving circuit 6 is 40 [W] (hereinafter, referred to as "standard power consumption Pb") in situations where the gate signal SG is not supplied to the power supply circuit 5 and the power supply circuit 5 supplies power to the driving circuit 6 at all times.

On the other hand, in situations where the power supply circuit 5 supplies power to the driving circuit 6 only for the duration of the pulse width Tg of the gate signal SG as in the present embodiment, the power consumption Pa of the driving circuit 6 can be represented by the following equation (4) using the standard power consumption Pb.

$$Pa = Pb \cdot \frac{Tg}{TS} = Pb \cdot Tg \cdot f \quad (4)$$

For example, when the cycle TS=10 [μs] (100 [KHz] in terms of frequency f) and the pulse width Tg=0.1 [μs], the power consumption Pa of the driving circuit 6 can be calculated as 0.4 [W] from equation (4). That is, the power consumption Pa of the driving circuit 6 is reduced to 1/100 of the standard power consumption Pb.

Further, as can be seen from equation (4), the effect of reducing the power consumption Pa of the driving circuit 6 becomes more prominent as the value of pulse width Tg/cycle TS becomes smaller.

Thus, the pulse width Tg is set as short as possible and to include the rise time of the generated pulse PL of the pulse signal SL.

For comparison, the power consumption Pd of the semiconductor laser 3 is calculated. The power consumption Pd can be calculated according to the following equation (5), using the cycle TS, the pulse width Td of the laser drive signal SD supplied from the driving circuit 6, the applied voltage VD, and the supplied current Id.

$$Pd = Vd \cdot Id \cdot \frac{Td}{TS} \quad (5)$$

When the cycle TS=5 [μs], the pulse width Td=500 [ps], the applied voltage VD=20 [V], and the current Id=2 [A] in equation (5), the power consumption Pd of the semiconductor laser 3 is 4 [mW].

Specifically, it can be seen that the power consumption Pa of the driving circuit 6 becomes far greater than the power consumption Pd of the semiconductor laser 3 when the value of (pulse width Td/cycle TS) is small. This suggests that a reduction in the power consumption Pa of the driving circuit 6 is effective in reducing the overall power consumption of the short-pulse light-source device 1.

In the short-pulse light-source device 1, there is more than one possible combination of the cycle TS, pulse width Tg, and other parameters that can suppress the power consumption Pa at a relatively low level. FIG. 24 lists some of the combinations of the cycle TS, pulse width Tg, and other parameters, along with other variables such as the power consumption Pa yielded by each combination.

For example, in the set pattern PTN5 of FIG. 24 in which the cycle TS=3.3 [ns] and the pulse width Tg=1.7 [ns], the power consumption reduction rate represented by the ratio of power consumption Pa/standard power consumption Pb is 0.5. Specifically, the short-pulse light-source device 1 can reduce the power consumption by reducing the power consumption Pa to a half of the standard power consumption Pb, even when the ratio of pulse width Tg/cycle TS is about ½.

Further, as represented in the set patterns PTN of FIG. 24, the cycle TS and the pulse width Tg can be set to the values of, for example, about 100 [μs] to about 3.3 [ns], and about 100 [ns] to about 1.7 [ns], respectively.

Similarly, as represented in the set patterns PTN, the semiconductor laser 3 can have a peak light output of, for example, 1 [W] to 300 [W]. Further, a peak voltage of, for example, 10 [V] to 40 [V], and a peak current of, for example, 1 [A] to 12 [A] can be set for the semiconductor laser 3. In this case, the semiconductor laser 3 can output light with a pulse width t of 0.1 [ps] to 100 [ps].

In this manner, in the short-pulse light-source device 1, the pulse width Tg of the gate signal SG is set as short as possible and to include the rise time of the generated pulse PL of the pulse signal SL, so as to reduce the power consumption Pa of the driving circuit 6.

[1-4-2. Configuration of Driving Circuit]

The configuration of the driving circuit 6 is described below. As illustrated in FIG. 25, the driving circuit 6 is configured in the same manner as a high-frequency power amplifying circuit. This is to meet the requirements of the high-speed operation with the extremely short pulse width Tg and pulse width Tu of, for example, about 100 [ns] and about 100 [ps], respectively.

The driving circuit 6 can be broadly divided into an input section 21, an amplification section 22, and an output section 23. The driving circuit 6 also includes impedance matching elements IM1 to IM11 provided at appropriate places using microstrips, in order to match the impedances of various signals and thus to prevent reflection.

The input section 21 receives the pulse signal SL, and supplies it to the gate terminal of a FET (Field Effect Transistor) Tr1. At the rise of the pulse signal SL from low level to high level, the FET Tr1 assumes the ON state to flow current between the source and drain, and supplies the current supplied via a coil L2 to the amplification section 22 of the following stage.

The amplification section 22 forms a push-pull amplifying circuit with FETTr2 and Tr3, and supplies the current from the input section 21 to the gate terminals of FETTr2 and Tr3 via coupling capacitors C1 and C2, respectively. The power supply circuit 5 supplies current to the FETTr2 and Tr3 via resistors R1 and R2, respectively.

The FETTr2 and Tr3 amplify the current supplied via the coupling capacitors C1 and C2 according to a push-pull operation, and supply the resulting current to the output section 23 of the following stage.

In the output section 23, the current supplied from the amplification section 22 is subjected to a balance-unbalance conversion with a balun BL realized by impedance matching elements IM9 and IM10.

Further, the output section 23 generates the laser drive signal SD by attenuating an unnecessary low-frequency range of the supplied current from the balun BL, using an LC filter realized by a capacitor C3 and a coil L3, and supplies the resulting signal to the semiconductor laser 3.

Note that, the FETTr1 to Tr3 can be formed using GaAs MES (Metal Semiconductor) FETs. Other than these, transistors such as HEMTs (High Electron Mobility Transistors), GaN, and HBTs (Heterojunction Bipolar Transistors) can be used.

In this manner, the driving circuit 6 performs a high-speed operation according to the generated pulse PL contained in the pulse signal SL, and generates the laser drive signal SD that contains the drive pulse PD of a short pulse width corresponding to the pulse width Tg of the generated pulse PL.

[1-5. Operation and Effects]

In accordance with the foregoing configuration, the pulse signal generator 4 of the laser control unit 2 in the short-pulse light-source device 1 generates the pulse signal SL in such a manner that the generated pulse PL rises after the delay time Tp with respect to the rising edge of the synchronization signal SS (FIG. 23), and supplies it to the driving circuit 6.

Further, the pulse signal generator 4 generates the gate signal SG in such a manner that the gate pulse PG rises at the rising edge of the synchronization signal SS, and that the pulse width Tg extends longer than the delay time Tp (FIG. 23), and supplies the resulting signal to the power supply circuit 5.

The laser control unit 2 operates the power supply circuit 5 and the driving circuit 6 only during the high-level periods of the gate signal SG and the pulse signal SL, specifically only for the durations corresponding to the pulse widths Tg and Tu, respectively.

As a result, as represented in equation (4), the driving circuit 6 can reduce the actual power consumption Pa by a factor of (pulse width Tg/cycle TS), compared with the standard power consumption Pb incurred when power is constantly supplied from the power supply circuit 5.

In the short-pulse light-source device 1, as described with reference to equations (4) and (5), the power consumption Pa by the driving circuit 6 accounts for a large proportion of the overall power consumption. Thus, the short-pulse light-source device 1 reduces the power consumption Pa of the driving circuit 6 to effectively reduce the overall power consumption.

For example, as represented by various combinations of the cycle TS, pulse width Tg, and other parameters in FIG. 24, the driving circuit 6 can reduce the power consumption Pa to about 1/100 to about 1/10,000 of the standard power consumption Pb.

In any of the combinations, necessary power can be supplied from the power supply circuit 5 to the driving circuit 6 at a required timing by raising the gate pulse PG of the gate signal SG to include the rise time of the generated pulse PL of the pulse signal SL in the pulse signal generator 4.

Further, as illustrated in FIG. 25, because the driving circuit 6 is configured in the same manner as a high-frequency power amplifying circuit, power can be supplied to the driving circuit 6 without almost any delay from the rise timing of the gate pulse PG.

Because the driving circuit 6 has relatively large power consumption, the switching time is relatively long. Further, because the driving circuit 6 is generally provided with a power smoothing capacitor (not illustrated) to take measure against noise problems, a stable operation requires some standby time from the start of operation.

Taking these into consideration, the pulse signal generator 4 raises the gate pulse PG of the gate signal SG before the delay time Tp for the rise of the generated pulse PL of the pulse signal SL.

This ensures that the power supply circuit 5 can supply the necessary power for the generation of the drive pulse PD to the driving circuit 6 at the rise of the generated pulse PL, specifically at the time when the driving circuit 6 outputs the drive pulse PD as the laser drive signal SD.

In other words, in the short-pulse light-source device 1, with a reduction in the standby time for the start of the operation of the power supply circuit 5, a corresponding reduction is possible in the delay time Tp and thus in the pulse width Tg. In this way, the short-pulse light-source device 1 can further reduce the power consumption Pa.

For example, when the standby time for the start of the operation of the power supply circuit 5 is short as to be negligible, the short-pulse light-source device 1 can eliminate the delay time Tp and reduce the pulse width Tg as short as the pulse width Tu of the generated pulse PL.

According the foregoing configuration, the laser control unit 2 of the short-pulse light-source device 1 raises the gate pulse PG of the gate signal SG supplied to the power supply circuit 5 only for the duration of the extremely short pulse width Tg so as to include the rise time of the generated pulse PL of the pulse signal SL supplied to the driving circuit 6. This enables the short-pulse light-source device 1 to supply necessary power at the rise timing of the generated pulse PL, and greatly reduce the power consumption Pa from the standard power consumption Pb.

2. Second Embodiment

In the Second Embodiment, as illustrated in FIG. 26, a short-pulse light-source unit 120 configured in the same manner as the short-pulse light-source device 1 is built into an optical disc apparatus 110 that records information in an optical disc 100 provided as an optical information recording medium.

[2-1. Configuration of Optical Disc]

The configuration of the optical disc 100 is described first. As illustrated in FIG. 27, information is recorded in the optical disc 100 by irradiation of an information light beam LM (corresponding to the laser beam LL) from the optical disc apparatus 110. Further, information is reproduced from the optical disc 100 by detecting a reflected information light beam LMr, the reflected light of the information light beam LM, in the optical disc apparatus 110.

In practice, the optical disc 100 has the overall' shape of substantially a disc, and, as illustrated in the cross section of FIG. 27, includes an information storing recording layer 101 between substrates 102 and 103.

The optical disc apparatus 110 is operable to condense the emitted information light beam LM from the light source in the recording layer 101 of the optical disc 100 through an objective lens 118.

The recording layer 101 includes a two-photon absorption material that undergoes two-photon absorption for the light of about a 404 [nm] wavelength. The two-photon absorption material is known to undergo two-photon absorption in a manner proportional to the square of the light intensity such that the absorption occurs only for the light of very strong light intensity. For the two-photon absorption material, materials such as hexadiyne compounds, cyanine dyes, merocyanine dyes, oxonol dyes, phthalocyanine dyes, and azo dyes can be used.

Upon irradiation of the recording layer 101 with the information light beam LM of a relatively strong intensity, the recording layer 101 undergoes two-photon absorption and forms bubbles by, for example, the vaporization of the two-photon absorption material. As a result, a recording mark RM is recorded at a focal point FM. Note that the recording layer 101 may be adapted to form the recording mark RM by, for example, chemical changes that vary the local refractive index.

It is known that the two-photon absorption material undergoes reaction proportional to the square of the light intensity. Specifically, the recording layer 101 undergoes reaction by absorbing only the information light beam LM of a very large intensity, for example, as in the vicinity of the focal point of the light condensed by the lens, and hardly any reaction is caused by the information light beam LM of a small intensity as in portions outside of the focal point. This enables the recording layer 101 to maintain high transmittance throughout.

The optical disc 100 also includes a servo layer 104 between the recording layer 101 and the substrate 102. The servo layer 104 has guide grooves for servo operations; specifically, spiral tracks (hereinafter, "servo tracks") KS in the form of lands and grooves are formed as in common BD-R (Recordable) discs.

The servo tracks KS have addresses given as a series of numbers for each predetermined recording unit. The addresses are used to specify the servo tracks (target servo tracks KSG) to be irradiated with a servo light beam LS (described later) during the recording and reproduction of information.

Instead of the guide grooves, the servo layer 104 (the interface between the recording layer 101 and the substrate 102) may be provided with, for example, pits, either alone or in combination with the guide grooves. Further, the tracks of the servo layer 104 are not limited to spiral tracks, and may be concentric tracks.

Further, the servo layer 104 has wavelength selectivity. For example, the servo layer 104 is adapted to reflect a red light beam of about a 660 [nm] wavelength with high reflectance, and transmit a blue-purple light beam of about a 404 [nm] wavelength with high transmittance.

The optical disc apparatus 110 irradiates the optical disc 100 with the servo light beam LS of about a 660 [nm] wavelength. The servo light beam LS is reflected by the servo layer 104 of the optical disc 100 and becomes a reflected servo light beam LSr.

The optical disc apparatus 110 receives the reflected servo light beam LSr, and, based on the information of the reflected servo light beam LSr, controls the position of the objective lens 118 in the focusing direction relative to the optical disc 100, thus placing the focal point FS of the servo light beam LS on the servo layer 104.

In the optical disc apparatus 110, the servo light beam LS and the information light beam LM have substantially the same optic axis XL. This enables the optical disc apparatus 110 to place the focal point FM of the information light beam LM in the recording layer 101 at a position corresponding to the target servo track KSG, specifically on the line normal to the servo layer 104 through the target servo track KSG.

As a result, the recording mark RM is formed in the optical disc 100 at the target position (hereinafter, "target position QG") that resides in the recording layer 101 and lies on the normal line to the target servo track KSG.

The recording marks RM are formed on the plane substantially parallel to each plane of the irradiation face 100A and the servo layer 104 of the optical disc 100, and form mark layers Y with the recording mark RM.

For the reproduction of information from the optical disc 100, the optical disc apparatus 110 condenses the information light beam LM on the target position QG, for example, through the irradiation face 100A. When the recording mark RM has been formed at the focal point FM (target position QG), the information light beam LM is reflected by the recording mark RM, and becomes the reflected information light beam LMr.

The optical disc apparatus 110 detects the reflected information light beam LMr, and generates a detection signals according to the result of detection. Based on the detection signals, the optical disc apparatus 110 finds whether the recording mark RM has been formed.

In this manner, in the recording and reproduction of information by the optical disc apparatus 110, the optical disc apparatus 110 irradiates the optical disc 100 with the information light beam LM at the target position QG, using the accompanying servo light beam LS.

[2-2. Configuration of Optical Disc Apparatus]

A specific configuration of the optical disc apparatus 110 is described below.

[2-2-1. Overall Configuration of the Optical Disc Apparatus]

As illustrated in FIG. 26, the optical disc apparatus 110 is centered around the control unit 111. The control unit 111 is configured to include a CPU (Central Processing Unit), a ROM (Read Only Memory) storing various programs or other data, and a RAM (Random Access Memory) used as the work area for the CPU (all not illustrated).

In recording information in the optical disc 110, the control unit 111 drives the spindle motor 115 to rotate via a drive control unit 112, and thus rotates the optical disc 100 at a desired speed on a turntable (not illustrated).

Further, the control unit 111 drives a sled motor 116 via the drive control unit 112 to move an optical pickup 117 in the tracking direction along movement shafts G1 and G2, specifically towards the inner side and outer side of the optical disc 100.

Various components are built into the optical pickup 117, including the objective lens 118 and other optical components, and the short-pulse light-source unit 120. Under the control of the control unit 111, the optical pickup 117 irradiates the optical disc 100 with the information light beam LM and the servo light beam LS (FIG. 27).

In the optical disc apparatus 110, disturbance such as surface wobbling may occur in the optical disc 100 under rotation. This may cause a change in the relative position between the target servo track KSG in the servo layer 104 and the focal point of the servo light beam LS condensed by the objective lens 118.

As a countermeasure, the optical pickup 117 detects the reflected servo light beam LSr of the servo light beam LS off the optical disc 100, generates detection signals based on the detection result, and supplies these signals to the signal processing unit 113.

Using the detection signals, the signal processing unit 113 performs a predetermined arithmetic process, generates a focusing error signal SFE and a tracking error signal STE, and supplies these signals to the drive control unit 112.

The focusing error signal SFE is a signal indicative of the amount of displacement of the servo light beam LS with respect to the servo layer 104 in the focusing direction. The tracking error signal STE is a signal indicative of the amount of displacement of the servo light beam LS with respect to the target servo track KS (target servo track KSG) in the tracking direction.

Based on the supplied focusing error signal SFE and tracking error signal STE, the drive control unit 112 generates a focusing drive signal and a tracking drive signal used to drive the objective lens 118, and supplies these signals to a biaxial actuator 119 of the optical pickup 117.

The biaxial actuator 119 of the optical pickup 117, based on the focusing drive signal and the tracking drive signal, moves the objective lens 118 in the focusing direction and the tracking direction (hereinafter, there operations will be referred to as "focus control" and "tracking control", respectively).

The focus control and tracking control by the drive control unit 112 enables the focal point FS of the servo light beam LS condensed by the objective lens 118 to follow the target servo track KSG of the target mark layer Y (hereinafter, "target mark layer YG").

Here, the control unit 111 supplies externally supplied record information to the signal processing unit 113. The signal processing unit 113 subjects the record information to a predetermined modulation process or the like to generate record data, and supplies the record data to the short-pulse light-source unit 120.

Based on the record data, the short-pulse light-source unit 120 modulates the information light beam LM, and forms a recording mark RM at the target position QG of the target mark layer YG. The optical disc apparatus 110 records information in the optical disc 100 in this manner.

In reproducing information from the optical disc 100, the optical pickup 117 makes the focal point FS of the servo light beam LS to follow the target servo track KSG as in the recording, and irradiates the target position QG of the target mark layer YG with a relatively weak information light beam LM.

The information light beam LM is reflected at the position of the recording mark RM, and becomes the reflected information light beam LMr. The optical pickup 117 detects the reflected information light beam LMr, generates detection signals based on the detection result, and supplies these signals to the signal processing unit 113.

The signal processing unit 113 subjects the detection signals to processes such as a predetermined arithmetic process, a demodulation process, and a decoding process to restore the information recorded in the form of the recording mark RM at the target position QG of the target mark layer YG. The optical disc apparatus 110 reproduces information from the target position QG of the optical disc 100 in this manner.

[2-2-2. Configuration of Optical Pickup]

The configuration of the optical pickup 117 is described below. As illustrated in FIG. 28, the optical pickup 117 includes a laser control unit 122, a servo optical system 130 provided primarily for the servo control of the objective lens 118, and an information optical system 150 provided primarily for the recording and reproduction of information.

By the optical pickup 117, the servo light beam LS emitted by a laser diode 131, and the information light beam LM emitted by the semiconductor laser 3 are incident on the objective lens 18 via the servo optical system 130 and the information optical system 150, respectively, to irradiate the optical disc 100.

The laser control unit 122 is configured to generate the laser drive signal SD that contains the drive pulse PG, and to supply the laser drive signal SD to the semiconductor laser 3, as with the laser control unit 2 (FIG. 1) of the First Embodiment.

[2-2-2-1. Light Path of the Servo Light Beam]

As illustrated in FIG. 29 analogous to FIG. 28, the servo optical system 130 is adapted to irradiate the optical disc 100 with the servo light beam LS via the objective lens 118, and to receive the reflected servo light beam LSr off the optical disc 100 at a photo detector 143.

Specifically, the laser diode 131 emits a divergent servo light beam LS of a predetermined light quantity under the control of the control unit 111 (FIG. 26), and the light is incident on a collimating lens 133. The collimating lens 133 converts the servo light beam LS from divergent rays to parallel rays, and the light is incident on a polarized light beam splitter 134.

The polarized light beam splitter 134 has different reflectance and transmittance depending on the polarization direction of the light beam; it transmits substantially all of the P-polarized servo light beam LS onto a ¼ wavelength plate 136.

The ¼ wavelength plate 136 converts the P-polarized (linearly-polarized) servo light beam LS to circularly-polarized light (for example, right circularly-polarized light), and the light is incident on a dichroic prism 137.

The dichroic prism 137 has a reflection/transmission face 137S whose reflectance varies according to the wavelength of the light beam. The light beam of about a 660 [nm] wavelength is reflected, whereas the light beam of about a 404 [nm] wavelength is transmitted.

In practice, the dichroic prism 137 at the reflection/transmission face 137S reflects the servo light beam LS into the objective lens 118.

The objective lens 118 condenses the servo light beam LS onto the servo layer 104 from the irradiation face 100A side of the optical disc 100. Here, as illustrated in FIG. 27, the servo light beam LS passes through the substrate 102 and reflected by the servo layer 104, and becomes the reflected servo light beam LSr that propagates in the opposite direction from the servo light beam LS. The rotational direction of circular polarization in the reflected servo light beam LSr is reversed from that in the servo light beam LS.

The reflected servo light beam LSr is then converted to parallel rays by the objective lens 118, and incident on the dichroic prism 137. The dichroic prism 137 reflects the reflected servo light beam LSr into the ¼ wavelength plate 136.

The ¼ wavelength plate 136 converts the circularly-polarized reflected servo light beam LSr to S-polarized light (linearly-polarized light), and the light is incident on the polarized light beam splitter 134. The polarized light beam splitter 134 reflects the S-polarized reflected servo light beam LSr at the reflection/transmission face 134S, and the light is incident on a condensing lens 141.

The condensing lens 141 converges the reflected servo light beam LSr into the photo detector 143 through a cylindrical lens 42 that provides astigmatism.

The photo detector 143 has a plurality of light receiving regions. In each light receiving region, a detection signal is generated according to the light quantity of the reflected servo light beam LSr, and these detection signals are sent to the signal processing unit 113 (FIG. 26).

In the servo optical system 130, the optical positions of the optical components are adjusted so that the focusing state of the servo light beam LS condensed by the objective lens 118 onto the servo layer 104 of the optical disc 100 is reflected in the focusing state of the reflected servo light beam LSr condensed by the condensing lens 141 onto the photo detector 143.

According to an astigmatic method, the signal processing unit 113 calculates the focusing error signal SFE indicative of the amount of displacement between the focal point FS of the servo light beam LS and the servo layer 104 of the optical disc 100, and supplies the signal to the drive control unit 112.

According to a push-pull method, the signal processing unit 113 calculates the tracking error signal STE indicative of the amount of displacement between the focal point FS and the target servo track KSG in the servo layer 104 of the optical disc 100, and supplies the signal to the drive control unit 112.

The drive control unit 112 generates a focusing drive signal based on the focusing error signal SFE, and supplies the focusing drive signal to the biaxial actuator 119. In this manner, the drive control unit 112 places the objective lens 118 under feedback control (focus control) to focus the servo light beam LS on the servo layer 104 of the optical disc 100.

Further, the drive control unit 112 generates a tracking drive signal based on the tracking error signal STE, and supplies the tracking drive signal to the biaxial actuator 119. In this manner, the drive control unit 112 places the objective lens 118 under feedback control (tracking control) to focus the servo light beam LS on the target servo track KSG on the servo layer 104 of the optical disc 100.

In this manner, the servo optical system 130 is adapted to irradiate the servo layer 104 of the optical disc 100 with the servo light beam LS, and to supply the information of the reflected servo light beam LSr to the signal processing unit 113. Accordingly, the drive control unit 112 is adapted to perform the focus control and tracking control of the objective lens 118 so as to focus the servo light beam LS on the target servo track KSG of the servo layer 104.

[2-2-2-2. Light Path of Information Light Beam]

As illustrated in FIG. 30 analogous to FIG. 28, the information optical system 150 is configured to emit the information light beam LM from the semiconductor laser 3, and to condense the information light beam LM in the optical disc 100 through the objective lens 118. Further, the information optical system 150 is configured to receive the reflected information light beam LMr of the information light beam LM off the optical disc 100.

Specifically, based on the laser drive signal SD supplied from the laser control unit 122, the semiconductor laser 3 emits a divergent information light beam LM into a collimating lens 152. The collimating lens 152 converts the information light beam LM from divergent rays to parallel rays, and the light is incident on the polarized light beam splitter 154.

The polarized light beam splitter 154 has a reflection/transmission face 154S, similar to the reflection/transmission face 134S, that transmits a P-polarized light beam, and reflects an S-polarized light beam. In practice, the polarized light beam splitter 154 transmits the P-polarized information light beam LM through the reflection/transmission face 154S, and the transmitted light is incident on a ¼ wavelength plate 157 via a LCP (Liquid Crystal Panel) 156 provided to correct, for example, spherical aberration.

The ¼ wavelength plate 157 converts the information light beam LM from P-polarized light (linearly-polarized light) to circularly-polarized light (for example, left circularly-polarized light), and the light is incident on a relay lens 158.

The relay lens 158 is configured to include a movable lens 158A movable along the optic axis direction of the information light beam LM, and a fixed lens 158B.

In practice, the relay lens 158 converts the information light beam LM from parallel rays to convergent rays through the movable lens 158A, and the information light beam LM diverged after the convergence is converted again into convergent rays through the fixed lens 158B before the light is incident on a mirror 159.

The mirror 159 reflects the information light beam LM and thus changes the direction of propagation for incidence on the dichroic prism 137. The dichroic prism 137 transmits the information light beam LM of about a 404 [nm] wavelength through the reflection/transmission face 137S, and the light is incident on the objective lens 118.

The objective lens 118 condenses the information light beam LM into the optical disc 100. Here, the information light beam LM passes through the substrate 102 and is focused in the recording layer 101, as illustrated in FIG. 27.

Here, the position of the focal point FM of the information light beam LM is determined by the state of convergence of the information light beam LM emerging from the fixed lens 158B of the relay lens 158. Specifically, the focal point FM changes its position in the recording layer 101 in the focusing direction according to the position of the movable lens 158A.

In practice, the control unit 111 (FIG. 26) controls the position of the movable lens 158A to enable the information optical system 150 to adjust the depth d (the distance from the servo layer 104) of the focal point FM (FIG. 27) of the information light beam LM in the recording layer 101 of the optical disc 100, thus placing the focal point FM on the target position QG.

Here, the objective lens 118 condenses the information light beam LM on the target position QG to form a recording mark RM on the target position QG.

In the reproduction of the information recorded in the optical disc 100, the information light beam LM condensed on the focal point FM is reflected by the recording mark RM and becomes the reflected information light beam LMr, if the recording mark RM is recorded on the target position QG.

The reflected information light beam LMr propagates in the opposite direction from the information light beam LM, and falls on the objective lens 118. The rotational direction of circular polarization in the reflected information light beam LMr is reversed from that in the information light beam LM.

When the recording mark RM is not recorded in the target position QG, almost all of the information light beam LM passes through the optical disc 100. Accordingly, hardly any reflected information light beam LMr is generated.

The objective lens 118, converges the reflected information light beam LMr to some extent, and the light is incident on the relay lens 158 via the dichroic prism 137 and the mirror 159.

The relay lens 158 converts the reflected information light beam LMr into parallel rays, and the light is incident on the ¼ wavelength plate 157. The ¼ wavelength plate 157 converts the circularly-polarized reflected information light beam LMr into S-polarized light (linearly-polarized light), and the light is incident on the polarized light beam splitter 154 via the LCP 156.

The polarized light beam splitter 154 reflects the S-polarized reflected information light beam LMr at the reflection/transmission face 154S, and the light is incident on a multiple-element lens 160. The multiple-element lens 160 condenses the reflected information light beam. LMr into a photo detector 162 via a pinhole plate 161.

The pinhole plate 161 is disposed so that the focal point of the reflected information light beam LMr condensed by the multiple-element lens 160 lies in an aperture 161H. As such, the reflected information light beam LMr directly passes through the pinhole plate 161. However, the pinhole plate 161 blocks the light whose focal point does not lie in the aperture 161H, specifically the light (stray light) reflected in portions other than the target position QG in the optical disc 100, for example.

This enables the photo detector 162 to generate reproduction detection signals according to the light quantity of the reflected information light beam, LMr, without the influence of the stray light. The signals are then supplied to the signal processing unit 113 (FIG. 26).

The signal processing unit 113 subjects the reproduction detection signals to processes such as a predetermined demodulation process and a decoding process to generate reproduction information, and supplies it to the control unit 111.

In this manner, the information optical system 150 is adapted to emit the information light beam LM from the semiconductor laser 3 based on the laser drive signal SD from the laser control unit 122, and to irradiate the optical disc 100 with the information light beam LM. Further, the information optical system 150 is adapted to receive the reflected information light beam LMr from the optical disc 100, and to supply the information of the reflected information light beam LMr to the signal processing unit 113.

[2-3. Configuration of the Short-Pulse Light-Source Unit]

The short-pulse light-source unit 120 is described below. As illustrated in FIG. 31 analogous to FIG. 1, the short-pulse light-source unit 120 differs from the short-pulse light-source device 1 of the First Embodiment in that a pulse signal generator 121, corresponding to the pulse signal generator 4, is externally provided.

The pulse signal generator 121 has some similarities to the configuration of the pulse signal generator 4 of the First Embodiment, and generates a synchronization signal SS of a predetermined cycle TS, as illustrated in FIG. 32(A) analogous to FIG. 23(A). As in the First Embodiment, the synchronization signal SS is a rectangular wave with a duty ratio of about 50%.

Further, as illustrated in FIG. 32(C) analogous to FIG. 23(C), the pulse signal generator 121 generates a pulse signal SL containing a generated pulse PL that rises in cycle TS.

As in the First Embodiment, the generated pulse PL of the pulse signal SL has an extremely short pulse width Tu of, for example, about 1 [ns] or about 500 [ps]. However, the Second Embodiment differs from the First Embodiment in that the generated pulse PL rises at the rise of the synchronization signal SS.

The pulse signal generator 121 is adapted to supply the synchronization signal SS and the pulse signal SL to the laser control unit 122 according, to information such as the record data supplied from the signal processing unit 113.

Specifically, the pulse signal generator 121 is adapted so that the generated pulse PL rises in the pulse signal SL in response to, for example, a supplied code "1", and does not rise in response to, for example, a supplied code "0".

Further, the pulse signal generator 121 is adapted to supply the synchronization signal SS to other circuits such as the signal processing unit 113 so as to synchronize the operation of these circuits with the operation of the laser control unit 122.

[2-3-1. Configuration of the Laser Control Unit]

The laser control unit 122 is configured to include a PLL (Phase Locked Loop) circuit 123, a gate signal generating circuit 124, a power supply circuit 125 corresponding to the power supply circuit 5 of the First Embodiment, and a driving circuit 126 corresponding to the driving circuit 6 of the First Embodiment.

The PLL circuit 123, based on the synchronization signal SS supplied from the pulse signal generator 121, generates a clock signal CLK in synchronism with the synchronization signal SS and of a cycle about 1/100 of the synchronization signal, and supplies the clock signal CLK to the gate signal generating circuit 124.

Based on the clock signal CLK, the gate signal generating circuit 124 generates a gate signal SG as represented in FIG. 32(B) analogous to FIG. 23(B), and supplies it to the power supply circuit 125.

The gate signal generating circuit 124 is adapted to generate the gate signal SG in such a manner that the gate pulse PG of the pulse width Tg rises in cycle TS as in the gate signal SG (FIG. 23(B)) of the First Embodiment.

However, in the Second Embodiment, the gate pulse PG rises earlier with a lead time of a leading pulse width Tg1 with respect to the rising edge of the synchronization signal SS, and falls with a time lag of a lagging pulse width Tg2 with respect to the rising edge of the synchronization signal SS.

The gate signal generating circuit 124 is adapted to raise the gate signal SG with a delay of predetermined numbers of clocks (for example, 90 clocks) after the rise of the synchronization signal SS. In this way, the gate signal SG rises earlier with a lead time of the leading pulse width Tg1 with respect to the rising edge of the synchronization signal SS of the next cycle.

The leading pulse width Tg1 corresponds to the delay time Tp of the First Embodiment, and is set taking into consideration factors such as the delay time for the operation of the power supply circuit 125 (described later). The lagging pulse width Tg2 corresponds to the difference between the pulse width Tg and the delay time Tp of the First Embodiment.

Thus, the gate pulse PG of the gate signal SG precedes the generated pulse PL of the pulse signal SL by an amount of the leading pulse width Tg1, and the fall of the gate pulse PG lags behind the generated pulse PL by an amount of the lagging pulse width Tg2. In other words, the gate pulse PG leads the synchronization signal SS and the generated pulse PL in terms of the rise phase.

The laser control unit 122 is adapted to set the pulse width Tg, the sum of the leading pulse width Tg1 and the lagging pulse width Tg2, as short as possible, as in the First Embodiment.

Specifically, the laser control unit 122 is adapted so that the gate pulse PG rises at least at the rise of the generated pulse PL, and that the gate pulse PG is prevented from rising as much as possible at other times, as in the laser control unit 2 of the First Embodiment.

The power supply circuit 125 supplies power to the driving circuit 126 based on the gate signal SG only during the rise time of the gate pulse PG of the gate signal SG, specifically only for the duration corresponding to the sum of the leading pulse width Tg1 and the lagging pulse width Tg2.

Using the power supplied from the power supply circuit 125, the driving circuit 126 generates a laser drive signal SD that contains the drive pulse PG corresponding to the generated pulse PL of the pulse signal SL, and supplies the laser drive signal SD to the semiconductor laser 3.

In the recording of information in the optical disc 100, the peak level of the drive pulse PG is at a singular voltage VE. Thus, the semiconductor laser 3 can emit the information light beam LM, specifically a singular output beam LE having a singular peak EPK of a pulse width on the order of, for example, several ten picoseconds, and a singular slope ESL (FIG. 22). As a result, the recording mark RM is formed on the target position QG in the optical disc 100.

As in the First Embodiment, the power consumption Pa of the driving circuit 126 can be calculated by equation (4). Thus, as in the driving circuit 6, the effect of reducing the power consumption Pa of the driving circuit 126 against the standard power consumption Pb becomes more prominent as the value of (pulse width Tg/cycle TS) becomes smaller.

The values of parameters such as the cycle TS and pulse width Tg in the short-pulse light-source unit 120 can be combined in a variety of ways as in FIG. 24 described in the First Embodiment. The leading pulse width Tg1 corresponds to the delay time Tp in FIG. 24.

In this manner, the short-pulse light-source unit 120 generates the laser drive signal SD in the laser control unit 122 based on the externally supplied synchronization signal SS and pulse signal SL, and supplies the laser drive signal SD to the semiconductor laser 3. The laser control unit 122 reduces the power consumption Pa of the driving circuit 126 by setting the sum of the leading pulse width Tg1 and the lagging pulse width Tg2 of the gate pulse PG in the gate signal SG as short as possible.

[2-3-2. Configuration of Driving Circuit]

The configuration of the driving circuit 126 is described below. As illustrated in FIG. 33, the power supply circuit 125 is adapted to acquire the gate signal SG from the gate signal generating circuit 124 (FIG. 31), and to supply power to the driving circuit 126 only during the high level period of the gate signal SG, specifically only for the duration corresponding to the pulse width Tg.

The power supply circuit 125 is operable at high speed because the pulse width Tg (the sum of the leading pulse width Tg1 and the lagging pulse width Tg2) has an extremely short time period of, for example, about 100 [ns].

The driving circuit 126 is configured in the same manner as a high-speed current switch circuit as a whole. This is to meet the requirements of the high-speed operation with the extremely short pulse width Tu of, for example, about 100 [ps], as in the First Embodiment.

The driving circuit 126 is connected to a power supply E11 via a terminal N1, and to a ground GND via a terminal N2 (grounded).

The terminal N1 is directly connected to the collector of a transistor Tr21. The collector of the transistor Tr21 is also connected to the terminal N1 via a resistor R22. The collector of the transistor Tr22 is connected to the bases of the transistors Tr21 and Tr22. The emitters of the transistors Tr21 and Tr22 are connected to the collectors of transistors Tr23 and Tr24, respectively.

The collector of the transistor Tr24 is connected to the bases of the transistors Tr23 and Tr24. The emitters of the transistors Tr23 and Tr24 are connected to the terminal N2 via resistors R25 and R26, respectively.

Supplying current to the terminal N1 from the power supply E11 causes the current to flow between the collectors and emitters of the transistors Tr21 and Tr22, thus supplying current to the collectors of the transistors Tr23 and Tr24. As a result, current also flows between the collectors and emitters of the transistors Tr23 and Tr24.

The terminal N1 is also connected to the base of a transistor Tr25, and to the collector and base of a transistor Tr26, via a resistor R24. The emitter of the transistor Tr26 is connected to the terminal N2 via a resistor R28.

Thus, in response to the supplied current to the terminal N1 from the power supply E11, the transistor Tr26 supplies a current of a predetermined potential to the base of the transistor Tr25.

The terminal N1 is also connected to the emitters of transistors Tr27 and Tr28 via resistors R21 and R23, respectively. The collector of the transistor Tr27 is connected to the collector of a transistor Tr29, and to the bases of the transistors Tr27 and Tr28.

The pulse signal SL from the pulse signal generator 121 (FIG. 31) is supplied to the base of the transistor Tr29. The emitter of the transistor Tr29 is connected to the emitter of the transistor Tr21, and to the collector of the transistor Tr23.

The collector of the transistor Tr28 is connected to the collector of the transistor Tr30, and to the bases of the transistors Tr30 and Tr31. The emitters of the transistors Tr30 and Tr31 are connected to the terminal N2 via resistors R27 and R29, respectively.

The collector of the transistor Tr31 is connected to the emitter of the transistor Tr25. In other words, the transistors Tr25 and Tr31 are cascode connected to reduce the risk of instability or oscillation during the high-frequency operation under high voltage. The collector of the transistor Tr25 is connected to the cathode of the semiconductor laser 3.

Thus, current flows between the collector and emitter of the transistor Tr29 at the rise of the generated pulse PL in the pulse signal SL, and as a result current is supplied to the bases of the transistors Tr27 and Tr28.

In response, current flows between the emitters and collectors of the transistors Tr27 and Tr28. As a result, current is supplied to the base of the transistor Tr30 to produce a collector-emitter current.

Here, current is also supplied to the base of the transistor Tr31. As a result, current is supplied to the bases of the transistors Tr25 and Tr31 to produce a collector-emitter current in the transistors Tr25 and Tr31.

As a result, the laser drive signal SD containing the drive pulse PD is supplied to the semiconductor laser 3 from the collector of the transistor Tr25. Here, the laser drive signal SD generates a negative drive pulse PD, and thus current is drawn from the semiconductor laser 3.

As a result, the supplied current from the power supply circuit 125 flows into the semiconductor laser 3 in pulses over extremely short time periods, causing the semiconductor laser 3 to emit the information light beam LM in pulses.

Because the driving circuit 126 forms large numbers of current mirror circuits including symmetrically connected transistors, the laser drive signal SD of a relatively large current, for example, about 2 [A], can be supplied to the semiconductor laser 3.

Note that the transistors Tr11, Tr12, and Tr21 to Tr31 can be realized by Si bipolar transistors; however, other transistors such as SiGe, CMOS (Complementary Metal Oxide Semiconductor), GaAs, HEMT, and HBT may be used as well.

In the manner described above, the power supply circuit 125 supplies power to the driving circuit 126 only during the rise time of the gate pulse PG of the gate signal SG. Accordingly, the driving circuit 126 is adapted to supply the laser drive signal SD containing the drive pulse PD to the semiconductor laser 3 at the rise of the generated pulse PL in the pulse signal SL.

[2-4. Operation and Effects]

According to the configuration described above, the laser control unit 122 of the optical disc apparatus 110 receives from the pulse signal generator 121 the synchronization signal SS of cycle TS, and the pulse signal SL that contains the generated pulse PL in synchronism with the rising edge of the synchronization signal SS.

The laser control unit 122 generates the gate signal SG containing the gate pulse PG that rises earlier with a lead time of the leading pulse width Tg1 with respect to the rising edge of the synchronization signal SS, and that falls with a time lag of the lagging pulse width Tg2 with respect to the rising edge of the synchronization signal SS, and supplies the gate signal SG to the power supply circuit 125. The laser control unit 122 also supplies the pulse signal SL to the driving circuit 126.

In this manner, the laser control unit 122 operates the power supply circuit 125 and the driving circuit 126 only during the high level periods of the gate signal SG and the pulse signal SL, specifically only for the durations corresponding to the pulse widths Tg and Tu.

Thus, as with the driving circuit 6 of the First Embodiment, the driving circuit 126 can reduce the actual power consumption Pa by a factor of (pulse width Tg/cycle TS) from the standard power consumption Pb incurred when power is constantly supplied from the power supply circuit 5, according to equation (4).

Further, as illustrated in FIG. 33, because the driving circuit 126 is configured in the same manner as a high-frequency power amplifying circuit, power can be supplied to the driving circuit 6 without almost any delay from the rise timing of the gate pulse PG.

Further, as in the First Embodiment, various values can be set for the parameters such as cycle TS and pulse width Tg in the Second Embodiment, as in FIG. 24.

The short-pulse light-source unit 120 has essentially the same effects as the short-pulse light-source device 1 of the First Embodiment.

According to the configuration described above, the laser control unit 122 of the short-pulse light-source unit 120 in the optical disc apparatus 110 supplies the pulse signal SL to the driving circuit 126. Further, the laser control unit 122 generates the gate signal SG containing the gate pulse PG of a leading pulse width Tg1 and a lagging pulse width Tg2 leading and lagging behind the generated pulse PL of the pulse signal SL, and supplies the gate signal SG to the power supply circuit 125. This enables the short-pulse light-source unit 120 to supply necessary power at the rise timing of the generated pulse PL, and to greatly reduce the power consumption Pa from the standard power consumption Pb.

3. Other Embodiments

As represented in FIG. 23 and FIG. 32, the foregoing First and Second Embodiments described the generated pulse PL that rises at the timing corresponding to substantially the center of the pulse width Tg of the gate pulse PG in the gate signal SG; specifically, the delay time Tp or the leading pulse width Tg1 is about a half of the pulse width Tg.

However, the present invention is not limited to this, and the delay time Tp and the leading pulse width Tg1 may be set in any ways within the range of the pulse width Tg. In this case, it is desirable to set the delay time Tp or leading pulse width Tg1 taking into account the standby time for the stable operation of the power supply circuit 5 or 125, as required.

The gate signal SG and the pulse signal SL have extremely high frequencies (for example, the pulse width Tg of the gate pulse PG is 0.1 [µs]), and thus the rise'time and fall time of the gate pulse PG and the generated pulse PL are extremely short.

For this reason, observing the gate signal SG and the pulse signal SL in the laser control unit 122 using a probe such as an oscilloscope may add a capacitance to the circuit element at the observation point, leading to a possible delay in the rise time and fall time of the observed signal waveform.

Specifically, the observation of a signal waveform with instruments such as a measurement device at each observation point in the short-pulse light-source device 1 or the short-pulse light-source unit 120 may produce results that differ from the timings represented in FIG. 23 or FIG. 32, depending on the measurement method.

Regarding this, the present invention only concerns the relative timing of the gate signal SG and the pulse signal SL. As such, irrespective of the measurement method, the results of measurement are relevant as long as the generated pulse PL rises in a short time period during the actual rise time of the gate pulse PG.

The foregoing First Embodiment described the laser drive signal SD generated in the driving circuit 6 (FIG. 25) configured in the same manner as a high-frequency power amplifying circuit. The Second Embodiment described the laser drive signal SD generated in the driving circuit 126 (FIG. 33) configured in the same manner as a high-speed current switch circuit.

However, the present invention is not limited to these, and the laser drive signal SD may be generated in the driving circuit 6 or driving circuit 126 having other circuit configurations.

Further, the foregoing First and Second Embodiments described synchronization signal SS generated in the pulse signal generator 4 and the pulse signal generator 121. However, the present invention is not limited to this. For example, the synchronization signal SS may be externally supplied from outside of the pulse signal generator 4, and signals such as the pulse signal PL and the gate signal SG may be generated based on the externally supplied synchronization signal SS.

Further, the foregoing First Embodiment described the pulse signal SL with the generated pulse PL that rises periodically, and the gate signal SG with the gate pulse PG that also rises periodically. However, the present invention is not limited to this. For example, the generated pulse PL may be adapted to rise at any timing, and the gate pulse PG may be adapted to rise according to this timing. In this case, the time difference between the generated pulse PL and the gate pulse PG can be set to the delay time Tp relatively easily when, for example, the generated pulse PL is adapted to rise in synchronism with an arbitrary rising edge of the synchronization signal SS.

Further, the First Embodiment described the pulse signal generator 4 provided in the laser control unit 122 of the short-pulse light-source device 1. However, the present invention is not limited to this, and the pulse signal generator 4 may be provided outside of the short-pulse light-source device 1 as in the Second Embodiment.

Similarly, the Second Embodiment described the pulse signal generator 121 provided outside of the short-pulse light-source unit 120 in the optical disc apparatus 110. However, the present invention is not limited to this, and the pulse signal generator 121 may be provided inside the laser control unit 122 as in the First Embodiment.

Further, the First and Second Embodiments described the semiconductor laser 3 emitting the light beam LL (information light beam LM) having a wavelength of 404 [nm]. However, the present invention is not limited to this. The light beam LL may have other wavelengths, for example, in the range of from 390 to 460 [nm]. Particularly in the Second Embodiment, the wavelength is not particularly limited as long as the recording mark RM can be appropriately formed in the vicinity of the target position QG in the recording layer 101, by appropriately selecting conditions such as the material of the recording layer 101 of the optical disc 100.

Further, the First and Second Embodiments described the drive pulse PD supplied in the form of a rectangular pulse current from the driving circuit 6 or 126 to the semiconductor laser 3. However, the present invention is not limited to this. The signal may have any form as long as a pulse current of a large oscillation voltage VB is supplied to the semiconductor laser 3 in a short time period. For example, a drive pulse PD in the form of a sinusoidal wave may be supplied.

Further, the First and Second Embodiments described the semiconductor laser 3 realized by a common semiconductor laser (for example, SLD3233; Sony Corporation). However, the present invention is not limited to this, as long as it is a so-called semiconductor laser performing laser oscillation using p-type and n-type semiconductors. It is more preferable to use a semiconductor laser specifically designed to undergo large relaxation oscillation.

The Second Embodiment described the recording layer 101 containing a two-photon absorption material that shows nonlinear absorption. However, the present invention is not limited to this. For example, the nonlinear absorption material may be nanoparticles of silver or gold that undergo plasmon resonance. Further, the information light beam LM may be shone in a recording layer that forms the recording mark RM according to a cumulative quantity of the light energy.

Further, though not described in the Second Embodiment, recording marks RM having the mark lengths of 2T to 11T may be formed, or information may be recorded by the presence or absence of a recording mark RM based on "1" and "0" allocated to 1T. Further, more than one oscillation output beam LB may be used for a single recording mark RM (1T), and the recording mark RM may be formed with two or more oscillation output beams LB.

Further, the First and Second Embodiments described the servo control that uses the servo layer 104. However, the present invention is not limited to this. For example, the servo control may be performed using a servo mark formed in advance in the recording layer 101 for servo control. In this case, the servo layer 104 does not need to be provided for the optical disc 100.

Further, the First and Second Embodiments described the hollow recording mark RM. However, the present invention is not limited to this. For example, the recording mark RM may be formed by causing chemical change to bring about a localized change in refractive index.

Further, the Second Embodiment described the laser control unit 122 provided in the optical pickup 117. However, the present invention is not limited to this, and the laser control unit 122 may be provided outside of the optical pickup 117.

Further, the Second Embodiment described the information light beam LM shone on the side of the substrate 102 of the optical disc 100. However, the present invention is not limited to this. The information light beam LM may be shone from either side or both sides of the optical disc 100, for example, from the substrate 103 side. As to the method of shining the information light beam LM from both sides, the method described in, for example, Patent Document 2 can be used.

The Second Embodiment described the disc-shaped optical disc 100 irradiated with the information light beam LM while being rotated in the optical disc apparatus 110. However, the present invention is not limited to this. For example, information may be recorded in a rectangular optical information recording medium by moving the objective lens 118 at a constant speed.

Further, the Second Embodiment described the optical disc apparatus 110 that records and reproduces information in and from the optical disc 100. However, the present invention is not limited to this, and the optical disc apparatus 110 may be adapted to only record information in the optical disc 100.

Further, the Second Embodiment described the short-pulse light-source unit 120, corresponding to the short-pulse light-source device 1, built into the optical disc apparatus 110. However, the present invention is not limited to this. The short-pulse light-source device 1 is also applicable to a wide range of devices including, for example, various types of medical equipment, and thermoresponse microscopes.

Further, the First Embodiment described the short-pulse light-source device 1 configured as a short-pulse light-source device by including the semiconductor laser 3 (a semiconductor laser), the power supply circuit 5 (a power supply circuit), the driving circuit 6 (a driving circuit), and the pulse signal generator 4 (a pulse signal generator). However, the present invention is not limited to this, and the short-pulse light-source device may be configured in other ways by including a semiconductor laser, a power supply circuit, a driving circuit, and a pulse signal generator of other configurations.

Further, the Second Embodiment described the short-pulse light-source unit 120 configured as a short-pulse light-source device by including the semiconductor laser 3 (a semiconductor laser), the power supply circuit 125 (a power supply circuit), and the driving circuit 126 (a driving circuit). However, the present invention is not limited to this, and the short-pulse light-source device may be configured in other ways by including a semiconductor laser, a power supply circuit, and a driving circuit of other configurations.

INDUSTRIAL APPLICABILITY

The present invention is applicable to optical information recording and reproducing apparatuses that record and reproduce a large volume of information, for example, such as video content and audio content in and from a recording medium such as an optical disc.

DESCRIPTION OF REFERENCE NUMERALS AND SIGNS

1 Short-pulse light-source device
2, 122 Laser control unit
3 Semiconductor laser
4 Pulse signal generator
5, 125 Power supply circuit
6, 126 Driving circuit
100 Optical disc
110 Optical disc apparatus
111 Control unit
112 Drive control unit
113 Signal processing unit
117 Optical pickup
118 Objective lens
120 Short-pulse light-source unit
121 Pulse signal generator
123 PLL
124 Gate signal generating circuit
LL Laser beam
LB Oscillation output beam
LE Singular output beam
EPK Singular peak
ESL Specific slope
SS Synchronization signal
SL Pulse signal
SD Laser drive signal
PL Generated pulse
PD Drive pulse
TS Cycle
Tg Pulse width
Tg1 Leading pulse width
Tg2 Lagging pulse width
Tp Delay time
RM Recording mark

The invention claimed is:
1. A short-pulse light-source device comprising:
a semiconductor laser to emit a laser beam in the form of a singular output beam having such light intensity characteristics as to include a pulsed singular peak and a singular slope of a smaller light intensity than that of the pulsed singular peak, the laser beam being emitted in response to a drive pulse supplied in pulses of a predetermined singular voltage;

a power supply circuit to acquire a gate signal containing a gate pulse indicative of a power supply timing, and to supply or cut power based on the gate pulse;

a driving circuit to acquire a pulse signal containing a control pulse indicative of an emission timing of the laser beam from the semiconductor laser, and to generate, using the power supplied from the power supply circuit, a laser drive signal containing the drive pulse that depends on the control pulse, and supply the laser drive signal to the semiconductor laser; and a pulse signal generator to generate and supply the pulse signal to the driving circuit, and to generate the gate signal in such a manner that the gate pulse rises to include at least a rise time of the control pulse in the pulse signal, and supply the gate signal to the power supply circuit.

2. The short-pulse light-source device according to claim 1, wherein the power supply circuit stably supplies the power to the driving circuit, after a predetermined start-up time, from the supply of the gate pulse, and wherein the pulse signal generator raises the gate pulse of the gate signal earlier by at least the predetermined start-up time before a rise of the control pulse in the pulse signal.

3. The short-pulse light-source device according to claim 1, wherein the pulse signal generator raises the gate pulse of the gate signal only for a duration of a rise time of the control pulse in the pulse signal.

4. The short-pulse light-source device according to claim 1, wherein the pulse signal generator periodically raises the gate pulse of the gate signal and the control pulse of the pulse signal in a cycle of a predetermined synchronization signal.

5. A laser driving method comprising:
a gate signal generating step of generating a gate signal containing a gate pulse indicative of a power supply timing and supplying the gate signal to a predetermined power supply circuit;
a power supplying step of allowing the power supply circuit to supply or cut power based on the gate pulse;
a pulse signal generating step of generating a pulse signal in such a manner that a control pulse indicative of an emission timing of a laser beam from a predetermined semiconductor laser and having a pulse width equal to or shorter than the gate pulse rises within a rise time of the gate pulse in the gate signal;
a laser drive signal generating step of generating a laser drive signal of a predetermined singular voltage that contains the drive pulse dependant on the control pulse, the laser drive signal being generated based on the pulse signal in a driving circuit that receives power from the power supply circuit; and
a laser beam emitting step of supplying the laser drive signal to the semiconductor laser so as to allow the semiconductor laser to emit a singular output beam of such light intensity characteristics as to include a pulsed singular peak and a singular slope of a smaller light intensity than that of the pulsed singular peak.

6. A short-pulse light-source device comprising:
a semiconductor laser to emit a laser beam in the form of a singular output beam having such light intensity characteristics as to include a pulsed singular peak and a singular slope of a smaller light intensity than that of the pulsed singular peak, the laser beam being emitted in response to a drive pulse supplied in pulses of a predetermined singular voltage;
a driving circuit to acquire a pulse signal containing a control pulse indicative of an emission timing of the laser beam from the semiconductor laser, and to generate, based on the pulse signal, a laser drive signal containing the drive pulse that depends on the control pulse, and supplies the laser drive signal to the semiconductor laser; and a power supply circuit to acquire a gate signal in which a gate pulse indicative of a timing of supplying power to the driving circuit rises over a time period that includes a rise time of the control pulse in the pulse signal, and to supply or cut power to the driving circuit based on the gate signal.

7. The short-pulse light-source device according to claim 6, further comprising:
a gate signal generator to acquire a synchronization signal of a first cycle, and to generate, based at least in part on the synchronization signal, the gate signal by periodically raising the gate pulse in the first cycle in a phase that leads the synchronization signal,
wherein the pulse signal is in synchronism with the synchronization signal and includes the control pulse that periodically occurs in phase with the synchronization signal.

8. The short-pulse light-source device according to claim 7, wherein the gate signal generator advances the phase of the gate pulse from the synchronization signal using a clock signal generated in a PLL (Phase Locked Loop) circuit based on the synchronization signal, the clock signal having a second cycle shorter than the first cycle and being in synchronism with the synchronization signal.

9. A laser driving method, comprising:
a gate signal acquiring step of acquiring a gate signal containing a gate pulse indicative of a power supply timing and supplying the gate signal to a predetermined power supply circuit;
a power supplying step of allowing the power supply circuit to supply or cut power based on the gate pulse;
a pulse signal acquiring step of acquiring a pulse signal in which a control pulse indicative of an emission timing of a laser beam from a predetermined semiconductor laser and having a pulse width equal to or shorter than the gate pulse rises within a rise time of the gate pulse in the gate signal;
a laser drive signal generating step of generating a laser drive signal of a predetermined singular voltage that contains the drive pulse dependant on the control pulse, the laser drive signal being generated based on the pulse signal in a driving circuit that receives the power from the power supply circuit; and
a laser beam emitting step of supplying the laser drive signal to the semiconductor laser so as to allow the semiconductor laser to emit a singular output beam of such light intensity characteristics as to include a pulsed singular peak and a singular slope of a smaller light intensity than that of the pulsed singular peak.

10. An optical pickup, comprising:
a semiconductor laser to emit a laser beam in the form of a singular output beam having such light intensity characteristics as to include a pulsed singular peak and a singular slope of a smaller light intensity than that of the pulsed singular peak, the laser beam being emitted in response to a drive pulse supplied in pulses of a predetermined singular voltage;
a power supply circuit to acquire a gate signal containing a gate pulse indicative of a power supply timing, and to supply or cut power based on the gate pulse;
a driving circuit to acquire a pulse signal containing a control pulse indicative of an emission timing of the laser beam from the semiconductor laser, and to generate, using the power supplied from the power supply circuit, a laser drive signal containing the drive pulse that depends on the control pulse, and supply the laser drive signal to the semiconductor laser;

a pulse signal generator to generate and supply the pulse signal to the driving circuit, and to generate the gate signal in such a manner that the gate pulse rises to include at least a rise time of the control pulse in the pulse signal, and supply the gate signal to the power supply circuit; and an objective lens that condenses the emitted laser beam from the semiconductor laser to irradiate a predetermined optical disc.

11. An optical disc apparatus, comprising:

a signal processor to generate record data that corresponds to a recording mark actually formed in a recording layer of an optical disc, the record data being generated according to information to be recorded in the optical disc;

a semiconductor laser to emit a laser beam in the form of a singular output beam having such light intensity characteristics as to include a pulsed singular peak and a singular slope of a smaller light intensity than that of the pulsed singular peak, the laser beam being emitted in response to a drive pulse supplied in pulses of a predetermined singular voltage;

a power supply circuit to acquire a gate signal containing a gate pulse indicative of a power supply timing, and to supply or cut power based on the gate pulse;

a driving circuit to acquire a pulse signal containing a control pulse indicative of an emission timing of the laser beam from the semiconductor laser, and to generate, using the power supplied from the power supply circuit, a laser drive signal containing the drive pulse that depends on the control pulse, and supply the laser drive signal to the semiconductor laser;

a pulse signal generator to generate and supply the pulse signal to the driving circuit, and to generate the gate signal in such a manner that the gate pulse rises to include at least a rise time of the control pulse in the pulse signal, and supply the gate signal to the power supply circuit;

an objective lens to condense the emitted laser beam from the semiconductor laser to irradiate the recording layer of the optical disc; and a condensed position controller to control a condensed position of the laser beam in the recording layer of the optical disc.

* * * * *